(12) United States Patent
Ramer et al.

(10) Patent No.: US 8,723,205 B2
(45) Date of Patent: May 13, 2014

(54) PHOSPHOR INCORPORATED IN A THERMAL CONDUCTIVITY AND PHASE TRANSITION HEAT TRANSFER MECHANISM

(75) Inventors: David Ramer, Reston, VA (US); Jack Rains, Herndon, VA (US)

(73) Assignee: ABL IP Holding LLC, Conyers, GA (US)

( * ) Notice: Subject to any disclaimer, the term of this patent is extended or adjusted under 35 U.S.C. 154(b) by 275 days.

(21) Appl. No.: 13/221,083

(22) Filed: Aug. 30, 2011

(65) Prior Publication Data
US 2013/0049040 A1    Feb. 28, 2013

(51) Int. Cl.
H01L 33/00    (2010.01)

(52) U.S. Cl.
USPC ............ 257/98; 257/99; 257/432; 257/712; 257/714; 257/E31.129; 977/955; 165/104.19; 165/104.22; 165/104.26; 362/294

(58) Field of Classification Search
None
See application file for complete search history.

(56) References Cited

U.S. PATENT DOCUMENTS

| | | | |
|---|---|---|---|
| 3,596,125 A | 7/1971 | Seigel | |
| 4,874,731 A | 10/1989 | Sachtler et al. | |
| 5,070,375 A | 12/1991 | Sakai | |
| 5,195,575 A | 3/1993 | Wylie | |
| 5,841,244 A | 11/1998 | Hamilton et al. | |
| 6,377,459 B1 | 4/2002 | Gonsalves et al. | |
| 6,766,817 B2 | 7/2004 | da Silva | |
| 6,827,134 B1 | 12/2004 | Rightley et al. | |
| 6,834,712 B2 | 12/2004 | Parish et al. | |
| 6,864,571 B2 | 3/2005 | Arik et al. | |
| 6,935,022 B2 | 8/2005 | German et al. | |
| 6,969,843 B1 | 11/2005 | Beach et al. | |
| 7,027,304 B2 | 4/2006 | Aisenbrey | |
| 7,028,759 B2 | 4/2006 | Rosenfeld et al. | |

(Continued)

FOREIGN PATENT DOCUMENTS

| | | |
|---|---|---|
| DE | 102 13 042 A1 | 10/2003 |
| EP | 0 144 071 A2 | 6/1985 |
| JP | 60-158649 A | 8/1985 |
| WO | WO 2007/069119 A1 | 6/2007 |

OTHER PUBLICATIONS

Entire prosecution history of U.S. Appl. No. 13/221,050, filed Aug. 30, 2011, entitled "Optical/Electrical Transducer Using Semiconductor Nanowire Wicking Structure in A Thermal Conductivity and Phase Transition Heat Transfer Mechanism."

(Continued)

*Primary Examiner* — Yasser A Abdelaziez
(74) *Attorney, Agent, or Firm* — RatnerPrestia

(57) ABSTRACT

A thermal conductivity and phase transition heat transfer mechanism has an opto-luminescent phosphor contained within the vapor chamber of the mechanism. The housing includes a section that is thermally conductive and a member that is at least partially optically transmissive, to allow emission of light produced by excitation of the phosphor. A working fluid also is contained within the chamber. The pressure within the chamber configures the working fluid to absorb heat during operation of the lighting device, to vaporize at a relatively hot location at or near at least a portion of the opto-luminescent phosphor as the working fluid absorbs heat, to transfer heat to and condense at a relatively cold location, and to return as a liquid to the relatively hot location. Also, the working fluid is in direct contact with or contains at least a portion of the opto-luminescent phosphor.

35 Claims, 12 Drawing Sheets

(56) References Cited

U.S. PATENT DOCUMENTS

| | | | |
|---|---|---|---|
| 7,095,110 | B2 | 8/2006 | Arik et al. |
| 7,124,809 | B2 | 10/2006 | Rosenfeld et al. |
| 7,137,443 | B2 | 11/2006 | Rosenfeld et al. |
| 7,148,632 | B2 | 12/2006 | Berman et al. |
| 7,164,466 | B2 | 1/2007 | Hazelton |
| 7,318,660 | B2 | 1/2008 | Yu |
| 7,505,268 | B2 | 3/2009 | Schick |
| 7,538,356 | B2 | 5/2009 | Lai |
| 7,543,960 | B2 | 6/2009 | Chang et al. |
| 7,547,124 | B2 | 6/2009 | Chang et al. |
| 7,572,033 | B2 | 8/2009 | Sun et al. |
| 7,651,260 | B2 | 1/2010 | Hamann et al. |
| 7,679,916 | B2 | 3/2010 | Orr et al. |
| 7,763,353 | B2 | 7/2010 | Geohegan et al. |
| 7,768,192 | B2 | 8/2010 | Van De Ven et al. |
| 7,819,556 | B2 * | 10/2010 | Heffington et al. ........... 362/294 |
| 7,821,022 | B2 | 10/2010 | Kim |
| 7,846,751 | B2 | 12/2010 | Wang |
| 7,857,037 | B2 | 12/2010 | Parish et al. |
| 7,898,176 | B2 | 3/2011 | Li et al. |
| 2004/0244963 | A1 | 12/2004 | Hazelton |
| 2006/0279191 | A1 | 12/2006 | Geohegan et al. |
| 2007/0295968 | A1 | 12/2007 | Tan et al. |
| 2008/0042429 | A1 | 2/2008 | Schick et al. |
| 2008/0093962 | A1 | 4/2008 | Kim et al. |
| 2008/0128898 | A1 | 6/2008 | Henderson et al. |
| 2008/0205062 | A1 | 8/2008 | Dahm et al. |
| 2008/0285271 | A1 | 11/2008 | Roberge et al. |
| 2009/0014154 | A1 | 1/2009 | Schick et al. |
| 2010/0038660 | A1 | 2/2010 | Shuja |
| 2010/0044697 | A2 | 2/2010 | Liu et al. |
| 2010/0200199 | A1 | 8/2010 | Habib et al. |
| 2010/0265717 | A1 | 10/2010 | Luettgens et al. |
| 2010/0283064 | A1 | 11/2010 | Samuelson et al. |
| 2011/0228516 | A1 | 9/2011 | Stewart et al. |
| 2011/0255268 | A1 | 10/2011 | Horn et al. |
| 2012/0026723 | A1 | 2/2012 | Wheelock et al. |
| 2012/0033440 | A1 | 2/2012 | Wheelock et al. |
| 2012/0044678 | A1 | 2/2012 | Aggarwal et al. |

OTHER PUBLICATIONS

Entire prosecution history of U.S. Appl. No. 13/221,244, filed Aug. 30, 2011, entitled "Thermal Conductivity and Phase Transition Heat Transfer Mechanism Including Optical Element to be Cooled by Heat Transfer of the Mechanism."

L. Davis et al., "Photoluminescent Nanofibers for Solid-State Lighting Applications," RTI International.

M.S. Dresselhaus, "Nanostructures and Energy Conversion," Proceedings of 2003 Rohsenow Symposium on Future Trends of Heat Transfer, May 16, 2003.

H. P. J. de Bock et al., "Experimental Investigation of Micro/Nano Heat Pipe Wick Structures," Proceedings of the ASME International Mechanical Engineering Congress and Exposition, IMECE2008, Oct. 31-Nov. 6, 2008.

T. Ogoshi et al., "Transparent ionic piqued-phenol resin hybrids with high ionic conductivity," Polymer Journal 43, 421-424 (Apr. 2011).

Ionic Liquids Today, Issue 3-07, Wednesday, Oct. 31, 2007, <www.iolitec.com>.

Y.-S. Cho et al., "Preparation of Transparent Red-Emitting $YVO_4$:Eu Nanophosphor Suspensions," Bull. Korean Chem. Soc. 2011, vol. 32, No. 1.

J. Oliva et al., "Effet of ammonia on luminescent properties of YAg:$Ce^{3+}$, $Pr^{3+}$ nanophosphors," Proc. SPIE 7755, 77550E (2010).

Engineers Edge Solutions by Design, "Fluid Characteristics Chart/Data, Density, Vapor Pressure and Viscosity/Data," printed from <http://www.engineersedge.com/fluid_flow/fluid_data.htm> on Aug. 15, 2011.

What is a Heat Pipe? printed from <http://www.cheresources.com/htpipes.shtml> on Aug. 15, 2011.

Notice of Allowance issued Feb. 10, 2014, in U.S. Appl. No. 13/221,050, entitled "Optical/Electrical Transducer Using Semiconductor Nanowire Wicking Structure in a Thermal Conductivity and Phase Transition Heat Transfer Mechanism.".

Notice of Allowance and Fee(s) Due issued Dec. 9, 2013, in U.S. Appl. No. 13/221,244, entitled "Thermal Conductivity and Phase Transition Heat Transfer Mechanism Including Optical Element to be Cooled by Heat Transfer of the Mechanism.".

\* cited by examiner

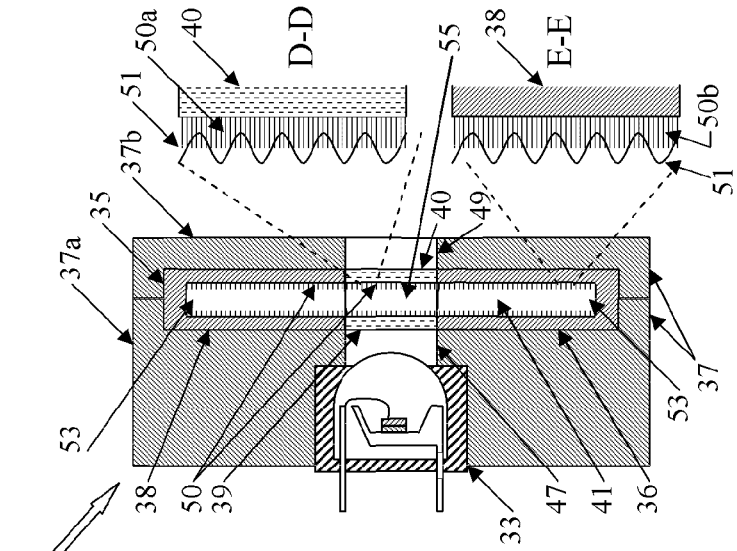
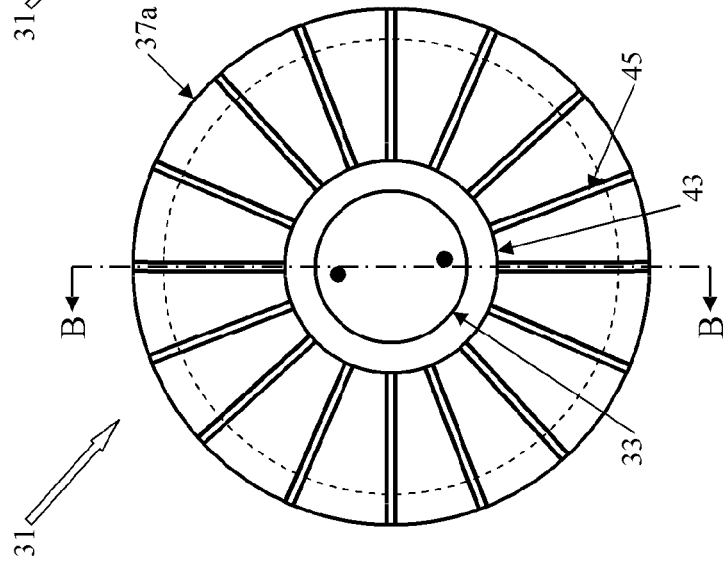

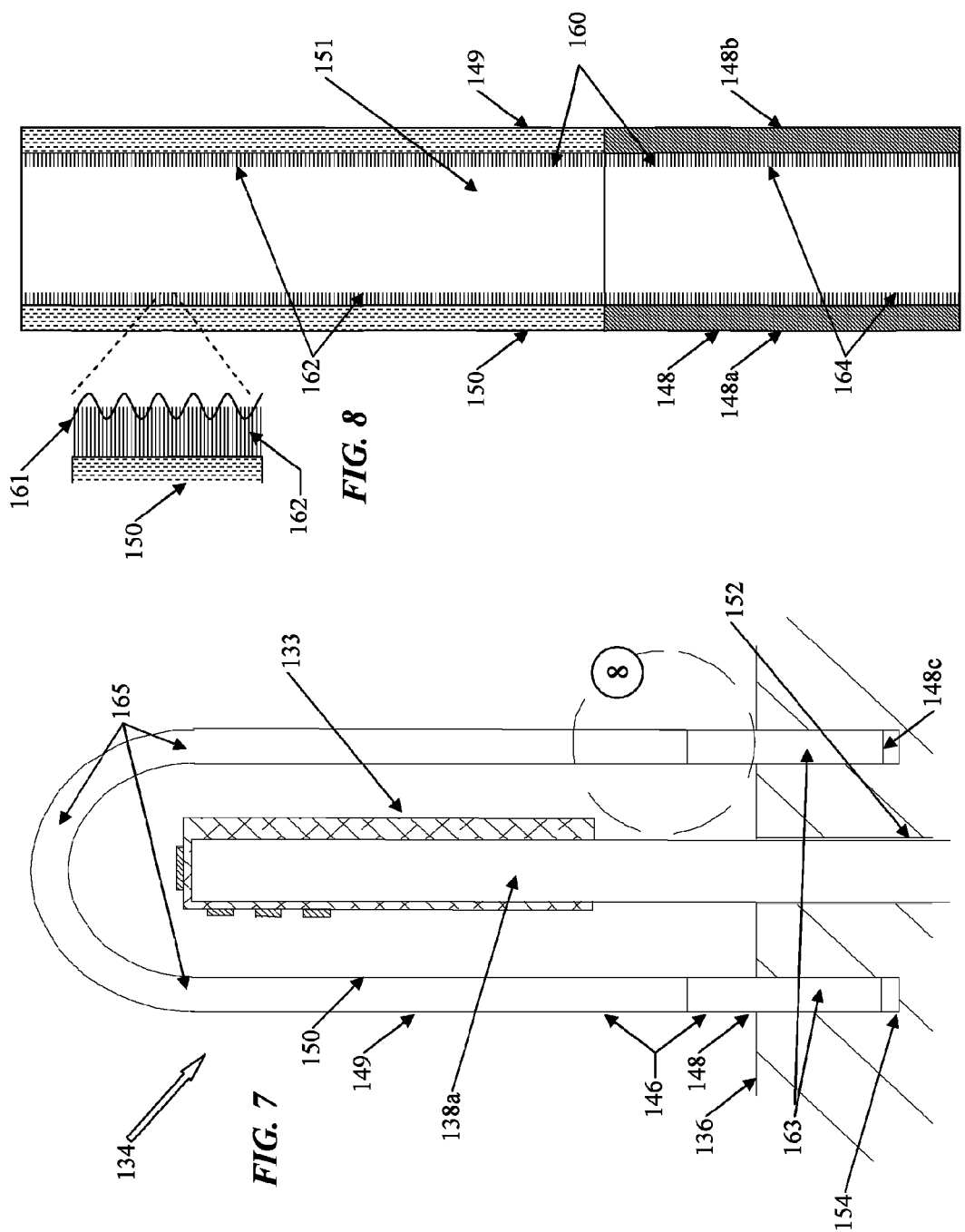

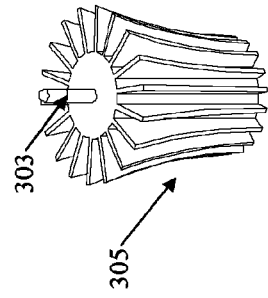
FIG. 15
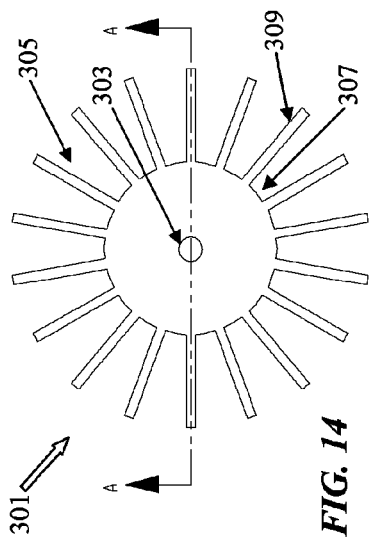
FIG. 14
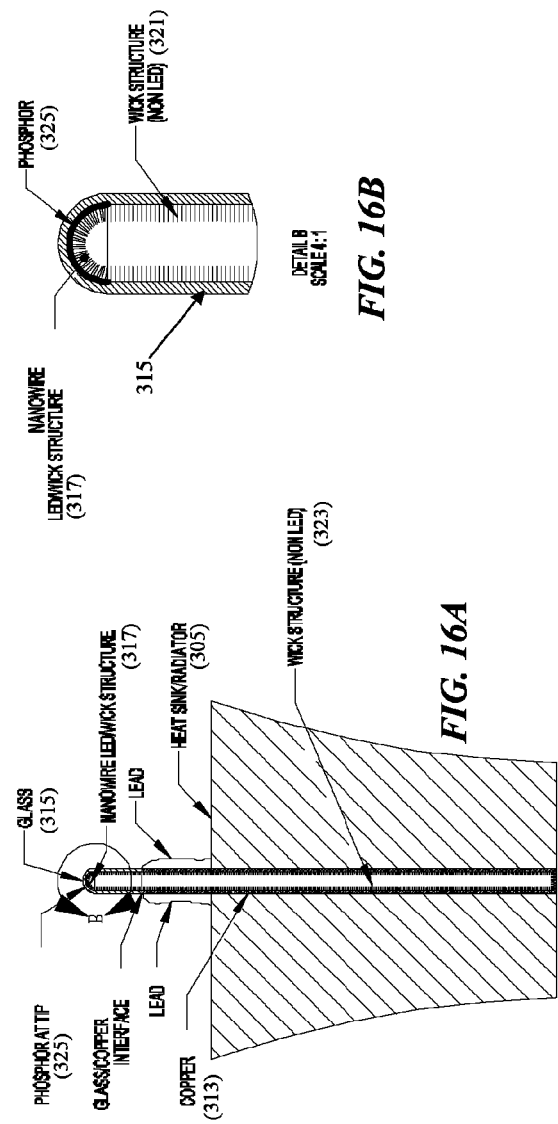
FIG. 16B
FIG. 16A

PHOSPHOR INCORPORATED IN A THERMAL CONDUCTIVITY AND PHASE TRANSITION HEAT TRANSFER MECHANISM

RELATED APPLICATIONS

This application is related to U.S. Utility application Ser. No. 13/221,244 Filed Aug. 30, 2011 entitled "THERMAL CONDUCTIVITY AND PHASE TRANSITION HEAT TRANSFER MECHANISM INCLUDING OPTICAL ELEMENT TO BE COOLED BY HEAT TRANSFER OF THE MECHANISM."

This application is related to U.S. Utility application Ser. No. 13/221,050 Filed Aug. 30, 2011 entitled "OPTICAL/ELECTRICAL TRANSDUCER USING SEMICONDUCTOR NANOWIRE WICKING STRUCTURE IN A THERMAL CONDUCTIVITY AND PHASE TRANSITION HEAT TRANSFER MECHANISM."

TECHNICAL FIELD

The present subject matter relates to various thermal conductivity and phase transition heat transfer mechanisms that incorporate phosphor materials to be cooled by operation of the mechanisms.

BACKGROUND

Many different types of light emitting or generating devices utilize optically luminescent materials or 'phosphors' to produce a desired light output. Opto-luminescent phosphors may be excited in response to an optical input energy, and in response will re-emit light, although typically the spectral characteristic of the output light is somewhat different than the spectral characteristic of the input light. Phosphors tend to degrade over time due to exposure to heat. However, many applications for phosphor subject the phosphors to heat during device operation.

Consider a solid state lighting device, for a general lighting application, by way of an example. The solid state light sources typically produce light of specific limited spectral characteristics. To change or enhance the spectral characteristic of a solid state light source, for example, to obtain white light of a desired characteristic, one approach currently favored by LED (light emitting diode) manufacturers, utilizes a semiconductor emitter to pump phosphors within the device package (on or in close proximity to the actual semiconductor chip). Another approach uses one or more semiconductor emitters, but the phosphor materials are provided remotely (e.g. on or in association with a macro optical processing element such as a diffuser or reflector outside the semiconductor package). At least some opto-luminescent phosphors that produce desirable output light characteristics degrade quickly if heated, particularly if heated above a characteristic temperature limit of the phosphor material.

Hence, phosphor thermal degradation can be an issue of concern in many lighting systems. Thermal degradation of some types of phosphors may occur at temperatures as low as 85° C. Device performance may be degraded by 10-20% or more. The lifecycle of the phosphor may also be adversely affected by temperature.

At least some of the recently developed semiconductor nanophosphors and/or doped semiconductor nanophosphors may have an upper temperature limit somewhere in the range of 60-80° C. The light conversion output of these materials degrades quickly if the phosphor material is heated to or above the limit, particularly if the high temperature lasts for a protracted period.

Maintaining performance of the phosphors therefore creates a need for efficient dissipation of any heat produced during light generation. A current mitigation technique for phosphor thermal degradation is to maintain separation of the phosphor from the heat source and maximize unit area of phosphor to minimize flux density. However, the need for more lumens in an output using the phosphor requires larger phosphor unit area, and any limits placed on the flux density to reduce thermal impact on the phosphor constrains the overall device design.

For equipment utilizing phosphors, there is a continuing need for ever more effective dissipation of heat. Improved heat dissipation may provide a longer operating life for the apparatus or device using the phosphor(s). Improved heat dissipation may allow a device to drive the phosphor harder, to emit more light, for a particular application.

Many thermal strategies have been tried to dissipate heat from and cool active optical elements, including those that have or are combined with phosphors. Many systems or devices use a heat sink to receive and dissipate heat from the hot system component(s) during operation. A heat sink is a component or assembly that transfers generated heat to a lower temperature medium. Although the lower temperature medium may be a liquid, the lower temperature medium often is air.

A larger heat sink with more surface area dissipates more heat to the ambient atmosphere. However, there is often a tension or trade off between the size and effectiveness of the heat sink versus the commercially viable size of the device that must incorporate the sink. For example, if a solid state lamp must conform to the standard form factor of an A-lamp to be a commercially viable product, then that form factor limits the size of the heat sink. To improve thermal performance for some applications, an active cooling element may be used, to dissipate heat from a heat sink or from another thermal element that receives heat from the active system element(s) generating the heat. Examples of active cooling elements include fans, Peltier devices, membronic cooling elements and the like.

Other thermal strategies for equipment have utilized heat pipes or other devices based on principles of a thermal conductivity and phase transition heat transfer mechanism. A heat pipe or the like may be used alone or in combination with a heat sink and/or an active cooling element.

A device such as a heat pipe relies on thermal conductivity and phase transition of a working fluid between evaporation and condensation to transfer heat between two interfaces. Such a device includes a vapor chamber and working fluid within the chamber, typically at a pressure somewhat lower than atmospheric pressure. The working fluid, in its liquid state, contacts the hot interface where the device receives heat input. As the liquid absorbs the heat, it vaporizes. The vapor fills the otherwise empty volume of the chamber. Where the chamber wall is cool enough (the cold interface), the vapor releases heat to the wall of the chamber and condenses back into a liquid. Thermal conductivity at the cold interface allows heat transfer away from the mechanism, e.g. to a heat sink or to ambient air. By gravity or a wicking structure, the liquid form of the fluid flows back to the hot interface. In operation, the working fluid goes through this evaporation, condensation and return flow to form a repeating thermal cycle that effectively transfers the heat from the hot interface to the cold interface. Devices like heat pipes can be more effective than passive elements like heat sinks, and they do not require power and/or mechanical moving parts as do active cooling elements. It is best to get the heat away from the active optical element and any other sensitive components such as a phosphor as fast as possible, and the heat pipe improves heat transfer away from the active optical element, even where transferring the heat to other heat dissipation elements.

Although these prior technologies do address the thermal issues somewhat, there is still room for further improvement, particularly with regard to thermal issues effecting the phosphor or phosphors in light emitting systems.

For example, passive cooling elements, active cooling elements and heat transfer mechanisms that rely on thermal conductivity and phase transition have been implemented outside of the devices that incorporate active optical elements and separate and apart from any phosphor that may be included in the light emitting system. A light processing device may include one or more elements coupled to the actual system element that generates the heat, to transfer heat to the external thermal processing device. Of note, these devices, cooling elements and related thermal mitigation strategies have not been specifically adapted to the cooling of phosphors.

There is an increasing desire for higher, more efficient operation (light output or response to light input) in ever smaller packages. As outlined above, thermal capacity may require control of heat at the phosphor level. Hence, it may be advantageous to improve technologies to more effectively dissipate heat from and/or around phosphor materials.

SUMMARY

The teachings herein alleviate one or more of the above noted problems and provide improvements in thermal mitigation of phosphors used in systems for generating light.

For example, a lighting device may include an opto-luminescent phosphor of a type excited by optical energy of a first spectral characteristic to emit light of a second spectral characteristic different from the first spectral characteristic. The lighting device also includes a source of optical excitation energy, for supplying the optical excitation energy to the phosphor. A housing has a section that is thermally conductive and a member that is at least partially optically transmissive, for allowing emission of light emitted from the phosphor as an output of the lighting device. The optically transmissive member is connected to the thermally conductive section of the housing to form a seal for a vapor tight chamber. The phosphor is contained within the chamber. The lighting device also includes a working fluid within the chamber. The pressure within the chamber configures the working fluid to absorb heat during operation of the lighting device, to vaporize at a relatively hot location at or near at least a portion of the opto-luminescent phosphor as the working fluid absorbs heat, to transfer heat to and condense at a relatively cold location, and to return as a liquid to the relatively hot location. The working fluid is in direct contact with or contains at least a portion of the opto-luminescent phosphor.

A variety of examples of phosphor configurations are discussed below and illustrated in the drawings. For example, the phosphor may be in a coating layer within the chamber, e.g. on a surface of the optically transmissive member. If a wicking structure is provided, the phosphor may be in or form part of the wicking structure, e.g. in the form of phosphor bearing nanowires that form at least part of the wicking structure. In other examples, the working fluid carries the phosphor.

Examples are considered in which the source is outside the lighting device and coupled to supply the optical excitation energy through an optically transmissive member to excite the phosphor. This member may be same as or in addition to the member through which re-emitted light from the phosphor is output from the device.

In other examples, the source is inside the chamber as well. For example, the source may be a semiconductor device of an appropriate type within the chamber that is also cooled by the thermal cycle of the working fluid. In several examples, the semiconductor light emitter includes semiconductor nanowires, which may serve as part of a wicking structure as well.

In the examples, the thermal cycle of the working fluid within the chamber transfers heat away from some or all of the excited phosphor. This improved heat transfer helps mitigate thermal degradation of the phosphor.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIGS. 2A-2E are various views of an example of a light emitting device or light engine, having a source and a thermal conductivity and phase transition heat transfer mechanism that incorporates a phosphor within the thermal conductivity and phase transition heat transfer mechanism.

FIG. 7 is an enlarged detailed view of the portion of the lamp cross-section encompassed by the oval 7 in FIG. 6, showing the thermal conductivity and phase transition heat transfer mechanism and the coupling thereof to the heat sink.

FIG. 8 is a still further enlarged detailed view of the portion of lamp cross-section encompassed by the circle 8 in FIG. 7, showing portions of the walls and wicks for the thermally conductive housing section and the optically transmissive members.

FIGS. 14 and 15 are top and isometric views of another example of a light emitting device and heat sink as may be used in a fixture or lamp/light bulb.

FIG. 16A is a cross-sectional view taken along line A-A of FIG. 14.

FIG. 16B is an enlarged detail view of a portion of the thermal conductivity and phase transition heat transfer mechanism that incorporates the phosphor, encircled by the arrow B in FIG. 16A, which also shows the phosphor layer.

DETAILED DESCRIPTION

Figure 1:
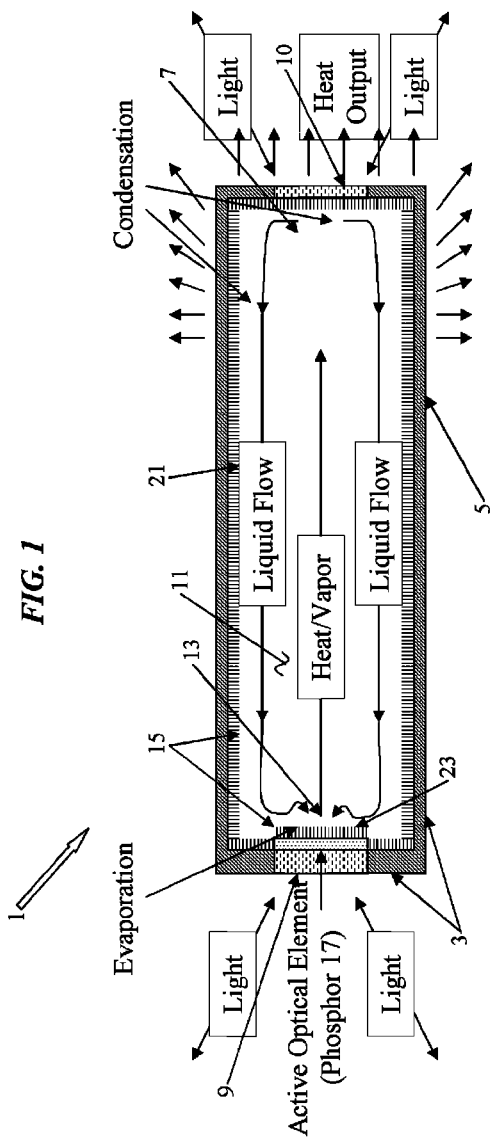
FIG. 1 is a cross-sectional view of an example of a thermal conductivity and phase transition heat transfer mechanism that incorporates a phosphor within the thermal conductivity and phase transition heat transfer mechanism.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various technologies disclosed herein relate to apparatuses, devices or systems for emitting light which utilize a phosphor, where the phosphor is included in the chamber of a cooling element such as a thermal conductivity and phase transition heat transfer mechanism. A variety of examples of such arrangements as well as techniques for making and operating such mechanisms, etc., that so include the phosphor, are discussed below.

For example, a thermal conductivity and phase transition heat transfer mechanism may have an opto-luminescent phosphor contained within the vapor chamber of the mechanism. Such a mechanism includes a housing having a section that is thermally conductive and at least one member that is at least partially optically transmissive. The optically transmissive member is connected to the thermally conductive section of the housing to form a seal for a vapor tight chamber. The mechanism also includes the opto-luminescent phosphor contained within the chamber for emitting light through the optically transmissive member when the phosphor is excited. A working fluid also is contained within the chamber. The pressure within the chamber configures the working fluid to absorb heat during operation of the lighting device, to vaporize at a relatively hot location at or near at least a portion of the opto-luminescent phosphor as the working fluid absorbs heat including heat from at least some of the phosphor. The vapor transfers heat to and condenses at a relatively cold location, and the vapor returns as a liquid to the relatively hot location. Also, the working fluid is in direct contact with or contains at least a portion of the opto-luminescent phosphor.

A lighting device, system or apparatus would include a mechanism like that outlined above, typically in combination with a source of optical energy for exciting the phosphor within the chamber. The source may be in the chamber as well, or the source may be outside the chamber and coupled to supply light to the phosphor within the chamber through an optically transmissive member.

The phase transition heat transfer via the thermal cycle of the working fluid more efficiently transfers heat produced during operation of the lighting device away from the excited phosphor. For example, at least some of the phosphor is directly exposed to the working fluid, without any additional intervening members, layers or interfaces that might otherwise impede the transfer of heat from the phosphor to the working fluid. The improved efficiency of the heat transfer and dissipation via the thermal conductivity and phase transition heat transfer mechanism may improve the operations and/or operational life of the semiconductor transducer. For example, it may be possible to operate the device using the phosphor at higher light or electrical power, and thus increase the excitation of the phosphor, without adverse impact on the performance or life of the phosphor.

Reference now is made in detail to the examples illustrated in the accompanying drawings and discussed below. FIG. 1 is a cross-sectional view of an example of a thermal conductivity and phase transition heat transfer mechanism 1 that incorporates a phosphor material. In this first example, the source of energy to pump or excite the phosphor is not included inside the mechanism and is omitted for ease of illustration and discussion. Later drawings show examples with the source outside the mechanism and as well as examples with the source inside the mechanism.

The mechanism 1 includes a housing 3. The housing 3 has at least one section that is thermally conductive. In the example of FIG. 1, the major section 5 of the housing 3 is formed of a thermally conductive material. Examples of suitable materials include metals, such as copper and aluminum, although other thermally conductive material materials, such as thermally conductive plastics and ceramics, may be used form manufacture the housing section 5.

The housing 3 has at least one member 9 that is at least partially optically transmissive. The first example of a mechanism includes two members 9 and 10, each of which is at least partially optically transmissive. Each optically transmissive member 9 or 10 may be transparent or translucent or exhibit other transmissive characteristics (e.g. non-white color filtering), depending on the optical requirements of the particular application of the mechanism 1. In an example like that of FIG. 1, in which the mechanism does not incorporate the source, at least one of the optically transmissive members 9, 10 would allow entry of optical energy from an external source, whereas one or both of the optically transmissive members 9, would allow emission of light as an output. The optically transmissive members 9 and 10 appear flat in cross-section, although they could have other shapes, e.g. convex or concave, if a particular shape would promote light input or light output for a particular application.

If the apparatus 1 is cylindrical, then when viewed from either end, the apparatus 1 would appear circular. Either member 9 or member 10 could be circular or have other shapes, even in a cylindrical implementation of the apparatus 1. Those skilled in the art will appreciate that the lateral shapes of the mechanism as a whole and of the optically transmissive member(s) may take other geometric forms, such as oval, rectangular or square, just to name a few examples.

The material forming each optically transmissive member 9 or 10 may be any material of sufficient optical transmissivity that is also able to withstand the expected operating temperatures of the mechanism 1. Examples of suitable materials for the members 9, 10 include various forms of glass ceramics and plastics. The material of the optically transmissive members 9, 10 may or may not need to be heat resistant, depending on the temperature at the location of each member during operation. Each optically transmissive member 9 or 10 is connected to the housing section 5 to form a seal for a vapor tight chamber 11 enclosed by the thermally conductive housing section 5 and the optically transmissive members 9, 10. The material of the member 9 or 10 is sufficiently transmissive to light, at least in the portion of the optical energy spectrum that is relevant to operations of the mechanism 1, so as to allow passage of optical energy into and/or out of the apparatus 1.

As noted, the optically transmissive members 9, 10 are attached to the housing section 5 to form a seal for a vapor tight chamber 11. For example, if the optically transmissive members 9, 10 are formed of a glass or ceramic material and the housing section 5 is formed of a metal, the different elements may be joined by a glass frit process or by application of a suitable epoxy.

An active optical element converts energy from one form or another by an electrical process and/or an excitation state change process, where at least one form of the energy is optical, e.g. light. Active optical elements include optically driven elements, such as optically pumped phosphors and electrical devices driven by light to produce electricity, as well as electrical devices and/or phosphors driven by electricity or electrical/electromagnetic fields to produce light. By contrast, passive optical elements process and even change the character of light, but by optical processing only, that is to say without use of an electrical and/or excitation state change process. Examples of passive optical elements include windows, lenses, optical color filters, reflectors, gratings, diffusers, and the like.

The mechanism or device 1 also includes an opto-luminescent phosphor 17 contained within the chamber for emitting light, when excited by optical pumping energy. The phosphor 17 is the active optical element of the mechanism or device 1. In some of the later examples, other active optical elements, in addition to the phosphor, are provided within the chamber 11 of the apparatus 1. As discussed more later, light emitted by the excited phosphor 17 is output from the mechanism via one or both of the optically transmissive members 9, 10. The heat transfer function of the mechanism 1 mitigates thermal impact on the phosphor 17.

A portion of the housing section 5 will form a cold location 7 within the chamber 11, for example, acting as or coupled to a heat sink (not separately shown). In the example of FIG. 1, a cold location 7 is formed near an end portion of the thermally conductive housing section 5 and the second optically transmissive member 10. Of course, any heat sink coupled to the mechanism at or near the cold location would not optically block passage of light to/from the optically transmissive member 10 in this example.

The exemplary apparatus 1 also includes a working fluid within the chamber 11. The pressure within the chamber 11, typically a pressure somewhat lower than atmospheric pressure, configures the working fluid to absorb heat during operation of the apparatus, to vaporize at a relatively hot location 13 as it absorbs heat, to transfer heat to and condense at the relatively cold location 7, and to return as a liquid to the relatively hot location. A variety of different fluids may be used as the working fluid, and the pressure is determined based on the fluid type and the amount of heat that the fluid is expected to transfer.

The working fluid, in its liquid state, contacts the hot interface at the location 13 where the apparatus receives or produces heat. In the example, the working fluid directly contacts at least some surface area(s) of the phosphor layer 17 at or near the hot location 13. At those surface areas, the working fluid absorbs at least some heat from the phosphor, be it heat generated by excitation of the phosphor or heat the phosphor may receive from the external excitation source.

As the liquid absorbs the heat, it vaporizes. The vapor fills the otherwise empty volume of the chamber 11. Where the chamber wall is cool enough (the cold interface at location 7), the vapor releases heat to the wall of the chamber 11 and condenses back into a liquid. The drawing shows a central arrow from the hot location 13 toward the cold location 7. This arrow generally represents the flow of heat in the vapor from the hot location 13 where the working fluid vaporizes toward the cold location 7 where the working fluid transfers heat for output via the thermally conductive housing section 5 and condenses back to the liquid form. The liquid form of the fluid flows back to the hot interface at location 13. The drawing shows arrows generally along the outer wall(s) of the housing from the relatively cold location 7 back to the relatively hot location 13. The arrows generally represent the flow of the condensed working fluid from the relatively cold location 7 back to the relatively hot location 13 where the fluid again vaporizes as it absorbs heat. In operation, the working fluid goes through this evaporation, condensation and return flow to form a repeating thermal cycle that effectively transfers the heat from the hot interface at location 13 to the cold interface at location 7.

The device 1 in the example thus is configured as a thermal conductivity and phase transition heat transfer mechanism, similar to many mechanisms which are sometimes referred to as "heat pipes." The thermal conductivity of the housing section 5 and the phase transition cycle through evaporation and condensation transfer heat from the hot location 13 to the cold location 7. Thermal conductivity at the cold interface allows heat transfer away from the mechanism, e.g. to a heat sink or to ambient air. Active cooling may also be provided. The configuration of the mechanism together with the degree of cooling determine the internal operating temperature, e.g. at the hot location 13. For example, the mechanism and a heat sink may support a maximum internal operating temperature around 50° C. Addition of active cooling or refrigeration at the cold interface may enable operation at a much lower internal temperature, such as 0° C.

Although some thermal conductivity and phase transition heat transfer mechanisms do not include a wicking structure, the exemplary mechanism 1 also includes a wicking structure 15 mounted within the chamber 11 to facilitate the flow of condensed liquid of the working fluid from the cold location 7 to the hot location 13 of the mechanism 1. Capillary action or "wicking" relies on inter-molecular forces between a liquid and the surface(s) of a material around the liquid to cause movement of the liquid along or through the material. This action can overcome other forces on the liquid, such as gravity, to promote a desired movement of the liquid. In the thermal conductivity and phase transition heat transfer mechanism, the wicking structure 15 promotes movement of the condensed liquid back from the cold location 7 to the hot location 13.

The wicking structure 15 may take many forms, such as sintered metal, phosphor, glass or ceramic powder; woven copper; surface grooves, mesh arrangements or small closely spaced wires extending inward from the surfaces of the housing forming the walls of the chamber 11; as well as nano-scale wire structures extending inward from the chamber surface (s); and various combinations of these forms. The spacing between elements of the wicking structure 15 is sufficiently small to cause inter-molecular forces on the liquid form of the working fluid to cause the liquid to flow toward the region where the fluid vaporizes, that is to say, the hot location 13 in the mechanism 1. This wicking or capillary action enables the liquid form of the working fluid to flow back to the hot location regardless of the orientation of (and thus the impact of gravity on fluid in) the heat transfer mechanism 1.

As noted briefly above, the mechanism 1 includes an active optical element 17 that is to be cooled by the thermo-dynamic operation of the combined phase transition heat transfer mechanism. In this case, the active optical element that is to be cooled is a phosphor that emits light when pumped, specifically an opto-luminescent phosphor contained within the chamber 11. The opto-luminescent phosphor 17 is contained within the chamber 11 formed by the housing 3 of the thermal conductivity and phase transition heat transfer mechanism 1, in such a manner that at least a portion of a surface of the phosphor 17 is directly contacted by the working fluid through gaps in the wick 23 formed on the phosphor layer 17, at the location 13 where the fluid evaporates as it absorbs heat. The phosphor may be provided in the chamber in a variety of different ways and other examples will be discussed below with regard to the later drawing figures. In this first example, the phosphor takes the form of a layer at 17 formed on an inner surface of the chamber 11, specifically a layer on the inward facing surface of the optically transmissive member 9.

The phosphor 17 will be subject to heating during operation, due to excitation and/or due to heat passing through the housing 5 into the chamber 11 from the external source, e.g. if the source is adjacent to the member 9 and the phosphor 17. The working fluid is directly in contact with at least a portion of the opto-luminescent phosphor 17.

The phosphor within the layer at 17 is of a type for emitting light when excited by optical energy. Some of the light produced by the excited phosphor passes through one or both of the optically transmissive members 9, 10. For example, if optical excitation energy is supplied to the phosphor in layer 17 via the first optically transmissive member 9, some phosphor emission may pass back through the optically transmissive member 9. However, much of the phosphor emission passes through the chamber 11 and the optically transmissive member 10. As discussed in more detail later, reflective materials may be provided on the walls of the chamber 11 to reduce loss of light passing through the chamber 11. The light for exciting the phosphor may also be applied through the optically transmissive member 10, instead of or in addition to excitation energy supplied through the optically transmissive member 9.

The "phosphor" 17 here may be any of a variety of optically excited luminescent materials. Terms relating to phosphor are intended to encompass a broad range of materials excited by optical energy of a first or 'excitation' band that re-generate light in a different second or 'emission' band that is at least somewhat different from the excitation band. Examples of phosphors that may be used in various applications discussed herein include traditional phosphors, such as rare-earth phosphors, as well as semiconductor nanophosphors sometimes referred to as quantum dots or Q-dots, and doped semiconductor nanophosphors. Those skilled in the art will also appreciate that phosphors of similar types and/or of different types, emitting light of different spectral characteristics, may be used in combination.

The orientation in the drawing, in which light enters the mechanism 1 and is emitted from the mechanism 1 in one or both lateral directions about a somewhat horizontal central axis, is shown only for purposes of illustration. Those skilled in the art will appreciate that the apparatus may be used in any other orientation that is desirable or suitable for any particular application of the mechanism 1. Some implementations may utilize additional optically transmissive members, to facilitate receipt or emission of light in additional directions. Although not shown, passive optical processing elements, such as diffusers, reflectors, lens and the like, may be coupled to each optically transmissive member to process light directed into the mechanism 1 or to process light emitted from the mechanism 1.

As noted earlier, the wicking structure 15 may take many forms. The wicking structure may be substantially the same on all of the relevant inner surfaces of the housing 5, or there may be somewhat different wicks at different locations within the chamber 11. For example, there may be two different types of wicks, one type wick 21 formed on the thermally conductive section 5 and possibly the optically transmissive member 10 and another type wick 23 formed on the phosphor layer 17. For example, the wick 23 may be transmissive and/or formed of the phosphor material as grooves or wire extensions of the phosphor material. The wick 21 may be at least somewhat reflective although the portion of the wick on the member 10 may be transmissive.

The example of FIG. 1 assumed that the source was outside of the mechanism 1, although in that first high-level example, the source was omitted. It may be helpful now to consider an example of a lighting device or system that incorporates a source and a thermal conductivity and phase transition heat transfer mechanism, with reference to FIGS. 2A to 3.

FIG. 2A is a back view of an example of a light emitting device or light engine 31, FIG. 2B is a cross-sectional view of an example of the light emitting device or light engine 31 (taken along line B-B of FIG. 2A), and FIG. 2C is an end or plan view of the light emitting device or light engine 31. The light emitting device 31 includes a source 33 and a thermal conductivity and phase transition heat transfer mechanism 35 that incorporates an opto-luminescent phosphor within the thermal conductivity and phase transition heat transfer mechanism 35. The light emitting device or light engine 31 also includes a heat sink 37.

In this example, the source 33 is outside of the thermal conductivity and phase transition heat transfer mechanism 35 but coupled to supply optical excitation energy to the mechanism 35 for optical excitation of the phosphor within the mechanism 35. The source may be any type of light emitter configured to supply optical energy in a wavelength range that includes at least a portion of the excitation band of the phosphor included within the mechanism 35. Examples of suitable sources include laser diodes and electroluminescent devices. However, most examples of the source 33 are solid state devices, including a wide range of devices referred to as light emitting diodes (LEDs).

As discussed herein, applicable solid state light emitters essentially include any of a wide range light emitting or generating devices formed from organic or inorganic semiconductor materials. Examples of solid state light emitters include semiconductor laser devices and the like. Many common examples of solid state emitters, however, are classified as types of "light emitting diodes" or "LEDs." This exemplary class of solid state light emitters encompasses any and all types of semiconductor diode devices that are capable of receiving an electrical signal and producing a responsive output of electromagnetic energy. Thus, the term "LED" should be understood to include light emitting diodes of all types, light emitting polymers, organic light emitting diodes (OLEDs), and the like. LEDs may be individually packaged, as in the illustrated example. Of course, LED based devices may be used that include a plurality of LEDs within one package, for example, multi-die LEDs that contain separately controllable red (R), green (G), blue (B) LEDs or the like, within one package. Those skilled in the art will recognize that "LED" terminology does not restrict the source to any particular type of package for the LED type source. Such terms encompass LED devices that may be packaged or non-packaged, chip on board LEDs, surface mount LEDs, and any other configuration of the semiconductor diode device that emits light. Solid state lighting elements may include one or more phosphors and/or nanophosphors, which are integrated into elements of the package to convert at least some radiant energy to a different more desirable wavelength or range of wavelengths.

The drawings show a single source, e.g. a single LED, OLED, laser diode, semiconductor nanowire light emitter, or electroluminescent device, at 33. However, those skilled in the art will appreciate that many light engine designs for the device 31 may include a number of similar or different sources, as required to provide sufficient light for a particular application of the light engine 31.

As in the earlier example of FIG. 1, the mechanism 35 includes a housing 36 having a section 38 that is thermally conductive and two members 39 and 40 that are at least partially optically transmissive. Although other shapes or configurations may be used, the example of FIGS. 2A-2C utilizes a cylindrical configuration of the mechanism 35 similar to that of FIG. 1, but where the cylinder is somewhat flattened or disk shaped so that the axial dimension of the cylinder is smaller than the radial dimension of the cylinder. The optically transmissive members 39 and 40 appear flat in cross-section, although they could have other cross-sectional configurations, e.g. convex or concave, if a particular shape would promote light input or light output for a particular application. Larger or additional optically transmissive members and/or members of different lateral shapes may be provided, e.g. to facilitate light input and/or output in a light engine using additional sources. The materials and the thermal and optical properties of the thermally conductive section 38 and the optically transmissive members 39, 40 forming the housing 36 can be similar to those discussed above relative to similar elements in the example of FIG. 1.

The orientation in FIG. 2B, in which light enters the mechanism 35 and is emitted from the mechanism 35 in the left to right direction about a somewhat horizontal central axis, is shown only for purposes of illustration. Those skilled in the art will appreciate that the light engine may be used in any other orientation that is desirable or suitable for any particular application of the mechanism 35.

The optically transmissive members 39, 40 are attached to the housing section 38 to form a seal for a vapor tight chamber 41. For example, if the optically transmissive members 39, 40 are formed of a glass or ceramic material and the housing section 38 is formed of a metal, the different elements may be joined by a glass frit process or by application of a suitable epoxy.

The heat sink 37 in this example is formed from two pieces 37a and 37b, which together form a tight-fitting cavity enclosing the housing section 38 of the mechanism 35. For example, the pieces 37a and 37b form a cylindrical cavity of approximately the same outer size and shape as the thermally conductive section 38 of the housing 36, so that when assembled as shown, the heat sink 37 provides structural support for the mechanism 35 and contact of the section 38 with the pieces 37a and 37b provides efficient thermal conductivity for heat transfer from the section 38 of the housing 36 to the heat sink 37.

As shown in FIG. 2A, the piece 37a of the heat sink 37 includes a core 43 and radially extending fins 45 for radiating heat to the ambient environment, in this case to the surrounding atmosphere. Straight radial fins are shown, for convenience, although other shapes/contours may be used for the fins, e.g. to improve transfer of heat to the ambient atmosphere. The core 43 of the heat sink 37 includes an indentation of an appropriate size and shape for securely holding the source 33. For example, the outer canister of the source 33 may serve as the heat slug for the source 33, and the canister of the source 33 may be press fitted into the indentation in the core 43 of the heat sink 37. The mounting of the source 33 in this way provides both structural support for the source 33 and efficient thermal conductivity for heat transfer from the source 33 to the heat sink 37.

The light output of the source 33 is coupled to the optically transmissive member 39 through a passage or aperture 47 through the core 43 of the first piece 37a of the heat sink 37. In this way, the source 33 supplies light, including at least some phosphor excitation energy, into the mechanism 35. The optically transmissive member 40 is coupled to a passage or aperture 49 through the second piece 37b of the heat sink 37. In this way, light from the source 33 and/or from excitation of phosphor within the chamber 41 of the mechanism 35 emerges through the optically transmissive member 40 and the passage 49. Each passage or aperture 47, 49 may be a physical opening as shown, or each passage or aperture 47, 49 may be formed of or include another optically transmissive element, such as a window, a lens, a holographic diffuser, a color filter or the like. The inner surfaces of the passages 47, 49 may be reflective, e.g. specular or diffusely reflective, to minimize loss of light.

Of course, the shape of the depicted elements and the arrangement of parts, in this case for the source, the mechanism and the heat sink, are given here by way of example only. Those skilled in the art will appreciate that other sizes, shapes, arrangements, etc. may be used for particular light engine applications. For example, FIG. 2B shows a relatively straight path from the source 33 through the two members 39, 40 and out the optical passage 49. For some applications, there may be additional members/paths/passages and/or the elements may be arranged to provide a somewhat angled or curved light transmission path.

As in the example of FIG. 1, the mechanism or device 35 also includes an opto-luminescent phosphor contained within the chamber 47 for emitting light when excited by optical pumping energy from the source 33. The phosphor is the active optical element of the mechanism or device 35. The particular phosphor of one or more different types is similar to the phosphor discussed above relative to the example of FIG. 1.

The arrangement of the phosphor in the mechanism or device 35 and the separate mounting of the source 33, with optical coupling there between, provide a form of "remote" deployment of the phosphor relative to the source 33 in that the phosphor is outside of the package enclosing the actual semiconductor chip or other light emitter of the source 33 and thus is apart or remote from the actual light emitter(s). The housing 38 containing the phosphor may be located at any convenient distance in relation to the light output of the source 33. For example, there may be a separation as shown between the light output of the source 33 and the nearest optically transmissive member 39. As another example, to provide efficient coupling of the light from the source 33 to the mechanism 35, the light output of the source 33 may be adjacent to the optically transmissive member 39 so that they are in direct contact or so that there is contact through an index of refraction matching material, such as an optical gel or optical adhesive.

The phosphor may be provided in the chamber 41 in a variety of different ways, including some ways outlined above. For example, the phosphor may be provided in the mechanism 35 as a layer formed on the inner surface of either one or both of the optically transmissive members 39, 40, similar to the layer 17 in the example of FIG. 1. Another approach to the phosphor deployment would be to include the phosphor in the working fluid 41. The light engine 31 also includes a wicking structure 50 mounted within the chamber 41 to facilitate flow of the condensed liquid of the working fluid from the cold location(s) to the hot location of the mechanism 35. The example of FIGS. 2A-2D incorporates the phosphor in the wicking structure, as will be discussed in more detail later, with respect to FIG. 2D.

As in the earlier example, a portion of the chamber 41 within the housing section 38 will form a cold location 53 within the chamber 41, and the housing section 38 in that location forms a cold interface for transfer of heat to the heat sink 37. In the example of FIGS. 2A-2C, the cold location 53 is formed around the periphery of the chamber 41, such that the outer periphery of the cylindrical section 38 of the housing serves as the cold interface. The relatively hot location 55 is in and possibly somewhat around the central region of the chamber between the optically transmissive members 39, 40. Phosphors in the wicking structure and/or fluid along the inner surfaces of the optically transmissive members 39, 40 would be at the hot location from which the thermal conductivity and phase transition heat transfer mechanism transfers heat.

As noted, the exemplary light engine 31 also includes a working fluid 51 within the chamber 41. The working fluid 51 is directly in contact with at least a portion of the opto-luminescent phosphor 17, in this example, within the wicking structure on one or both of the optically transmissive members 39, 40. The pressure within the chamber 41, typically a pressure somewhat lower than atmospheric pressure, configures the working fluid 51 to absorb heat during operation of the light engine 31, including heat from the phosphor produced by phosphor excitation and/or received from the source 33. The working fluid 51, in its liquid state, contacts the hot interface at the location 55 where the mechanism 35 receives or produces heat. In the example, the working fluid directly contacts at least some surface area(s) of the phosphor at or near the hot location 55. When heated at the relatively hot location 55, the working fluid 51 vaporizes. The vapor flows outward to the periphery of the chamber 41 to the cold location(s) 53 at the periphery of the chamber 51 in this example. At the cold location(s) 53, heat is transferred from the vapor to the wall of the section 38 of the housing and from there to the heat sink 37 for dissipation to ambient air and/or via an external cooling system (not shown). The transfer of heat to the housing section 38 causes the vapor to condense back to the liquid form, at the relatively cold location(s) 53. Through the capillary action of the wicking structure 50, the liquid form of the working fluid 51 flows to the relatively hot location 55 at the center of the mechanism 35. A variety of different fluids may be used as the working fluid, and the pressure is determined based on the fluid type and the amount of heat that the fluid is expected to transfer.

The mechanism 35 within the light engine 31 in the example thus is configured as a thermal conductivity and phase transition heat transfer mechanism. The thermal conductivity of the housing section 38 and the phase transition cycle through evaporation and condensation transfer heat from the hot location 55 to the cold location(s) 53. Thermal conductivity at the cold interface allows heat transfer away from the mechanism, e.g. through the heat sink to ambient air.

As shown by the discussion of FIGS. 2A-2C, the mechanism 35 in the light engine 31 includes a wicking structure 50 mounted within the chamber 41 to facilitate the flow of condensed liquid of the working fluid 51 from the cold location(s) 53 to the hot location 55 of the mechanism 35. As in the example of FIG. 1, the wicking structure 50 may take many forms, such as sintered metal, phosphor, glass or ceramic powder; woven copper; surface grooves, mesh arrangements or small closely spaced wires extending inward from the surfaces of the housing forming the walls of the chamber 41; as well as nano-scale wire structures extending inward from the chamber surface(s); and various combinations of these forms. The spacing between elements of the wicking structure 50 is sufficiently small to cause inter-molecular forces on the liquid form of the working fluid 51 to cause the liquid to flow toward the region where the fluid vaporizes, that is to say, the hot location 55 in the mechanism 35. This wicking or capillary action enables the liquid form of the working fluid to flow back to the hot location regardless of the orientation of (and thus the impact of gravity on fluid in) the heat transfer mechanism 35.

Figure 4:
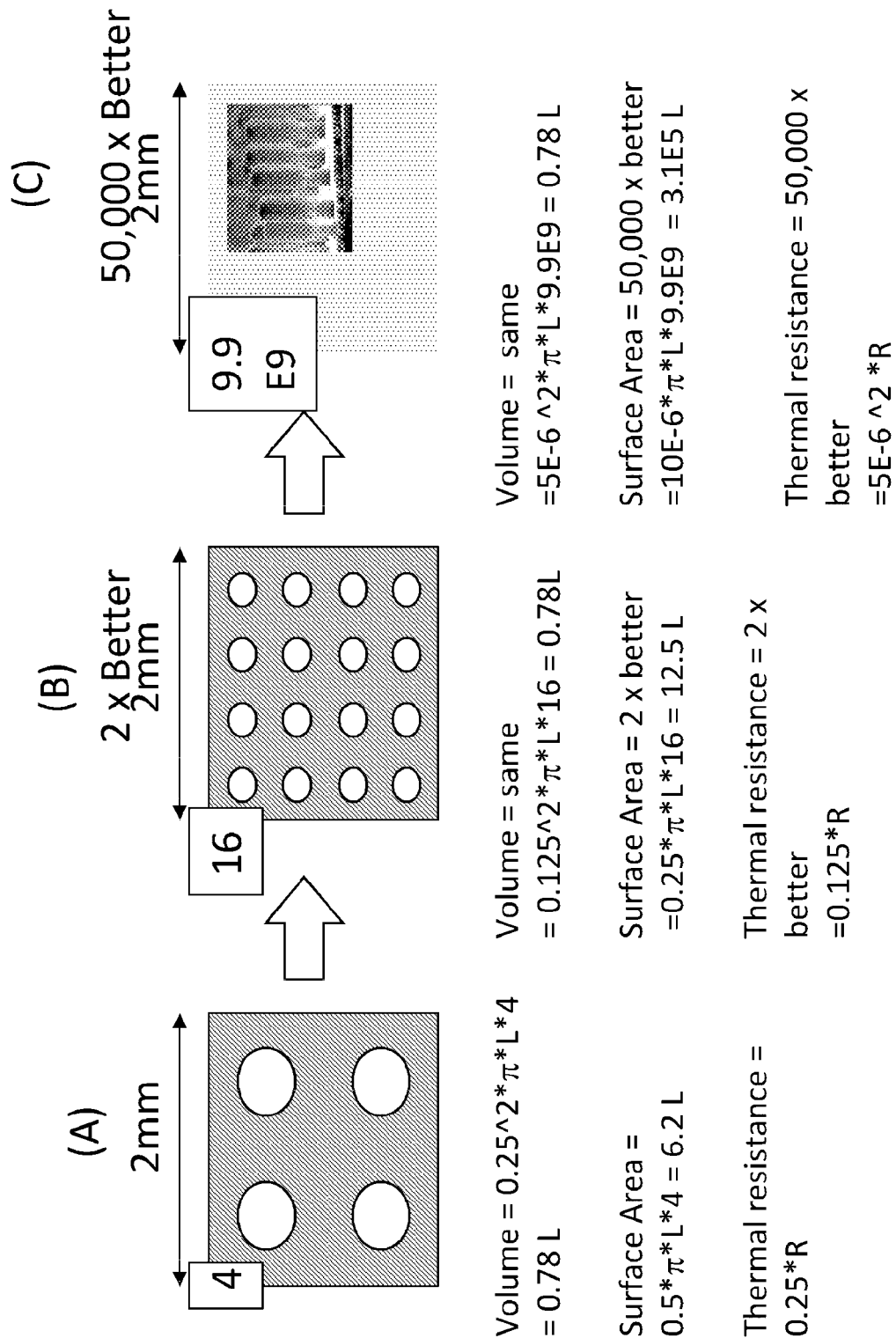
FIG. 4 is a comparative diagram useful in explaining how reducing the size and increasing the number of thermal elements per unit area increases the surface area for heat transfer and reduces the thermal resistance, and thus shows the advantages of using nanowires or similarly sized elements in the wicking structure of a thermal conductivity and phase transition heat transfer mechanism.

As discussed more later, particularly with regard to FIGS. 2D, 2E and 4, the mechanism 35 in our example uses wicks for the structure 50 that utilize nanowires. Nanowires are wire-like structures having nano-scale cross-sectional dimensions. Although the cross-section of a nanowire may not be circular, it is often easiest to consider the lateral dimension of the nanowire to be a diameter. A nanowire therefore may have an outer diameter measured in nanometers, e.g. in a range of approximately 1-500 nanometers. Hence, "nanowire" is meant to refer to any continuous wire or filament of indefinite length having an average effective diameter of nanometer (nm) dimensions. The "nanowire" term is therefore intended to refer to nanostructures of indefinite length, which may have a generally circular cross-sectional configuration or a non-circular cross-section (e.g. nanobelts having a generally rectangular cross-section).

Also as noted above, the mechanism 35 includes an active optical element, in this case, a phosphor within the chamber 41 that is to be cooled by the thermo-dynamic operation of the combined phase transition heat transfer mechanism. At least a portion of a surface of the phosphor is directly contacted by the working fluid 51 at the location 55 where the fluid evaporates as it absorbs heat. The phosphor may be provided in the chamber in a variety of different ways, for example, as a layer like that in FIG. 1 or carried by the working fluid 51. However, for purposes of further discussion of the example of FIGS. 2A-2E, we will consider an arrangement in which the phosphor forms or is carried by material forming a nanowire structure serving as a portion of the wicking structure 50 of the mechanism 35. Other portions of the wicking structure 50 may have other structures or characteristics, although the specific example below will concentrate on an arrangement in which some or all of the other portions of the wicking structure 50 are at least somewhat reflective.

Figure 2D:
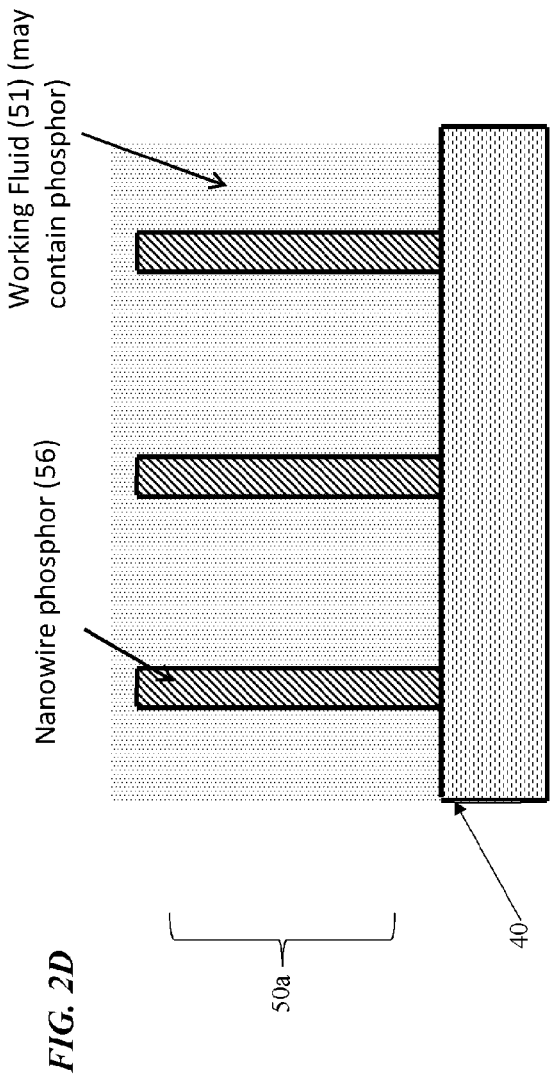

FIG. 2B shows partially enlarged views of sections E-E and D-D of the chamber wall and associated wicking structures at two different exemplary locations. The view D-D corresponds to a location on one of the optically transmissive members, for example, of member 40; whereas the view E-E corresponds to a location on the thermally conductive section 38 of the housing of the mechanism 35. FIG. 2D is a further enlarged view corresponding to D-D in FIG. 2B, and FIG. 2E is a further enlarged view corresponding to E-E in FIG. 2B.

Figure 2E:
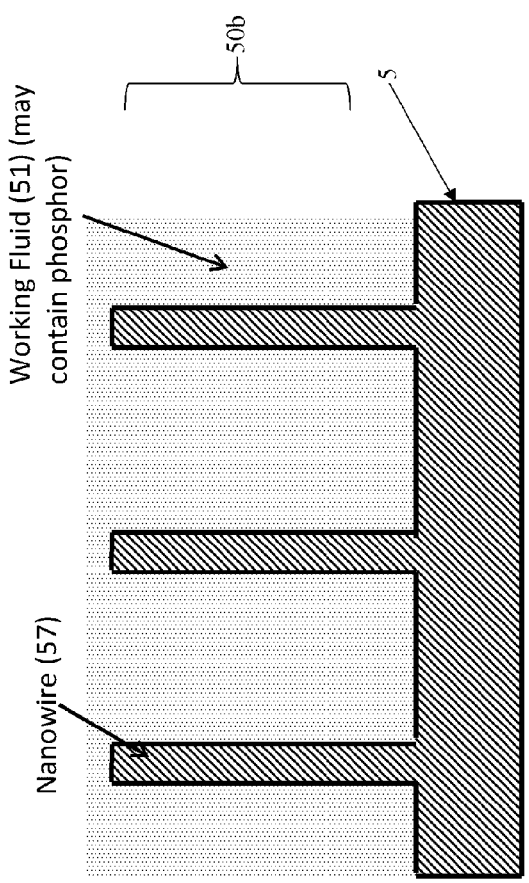

FIGS. 2D and 2E show two specific examples of arrangements that may be used as portions 50a (FIG. 2D) and 50b (FIG. 2E) of the wicking structure 50 in the light engine 31 of FIGS. 2A-2C. The example of FIG. 2E uses a wicking arrangement 50a formed of nanowires 56 on a surface of one of the optically transmissive members. The nanowire wicking arrangement could be on either one or both of the optically transmissive members 39, 40, although for convenience, the enlarged view in FIG. 2D shows the nanowire wicking structure arrangement 50a formed on the inner surface of the optically transmissive member 40. The nanowires 56 of the wicking structure 50a are formed of or include an optically luminescent material, of a type discussed earlier relative to FIG. 1. The phosphor or a medium bearing the phosphor may be grown as nanowires 56 extending inward into the interior of the chamber 41 from the inner surface of the either one or both of the optically transmissive members 39, 40. By way of an example, particles of suitable phosphor(s) may be dispersed in a polymer matrix, and the phosphor-polymer matrix is grown in the form of nanowires. Examples of suitable polymers include epoxies and silicon. A barrier layer of a few nanometers up to around a micron may be provided on the surface of the phosphor nanowires 56, so long at the barrier layer does not substantially impede flow of light to or from the phosphor or flow of heat from the excited phosphor to the fluid.

The phosphor converts some of the optical energy within the chamber 41 from energy in one wavelength range (the excitation band of the phosphor) to another somewhat different wavelength range. There may or may not be some overlap of the excitation and emission spectra of the phosphor. In the light engine 31 of FIGS. 2A-2C, the phosphor may convert some energy from the source 33 from a less desirable wavelength range (e.g. near or outside the visible spectrum) to a more desirable wavelength range (e.g. to fill-in a gap in the spectrum of the output of light engine 31 and/or to improve the quality of the light output). For example, the phosphor in the nanowires 56 receives light emitted by the source through one optically transmissive member 39, recycles such light and retransmits it within the chamber 41 for passage through the optically transmissive member 39.

The mechanism 35 of the light engine 31 is configured with the wicking arrangement 50a formed of nanowires 56 that contain phosphor in regions where the phosphor is most likely to receive optical pumping energy from the source 33 and re-emit converted light for output as part of the light output of the light engine 31 through the optical aperture 49, that is to say on one or both of the optically transmissive members 39, 40. The wicking arrangement 50b could similarly include phosphor nanowires. However, in the example, instead of a phosphor wicking structure as in FIG. 2D, the example of FIG. 2E uses a metal nanowire wicking structure 50b. In the example of FIG. 2E, metallic nanowires 57 of sufficient size and closeness to function as the wicking structure are grown so as to extend inward from the inner surface of the section 38 of the housing. In addition to supporting the capillary wicking function, the nanowires 57 may also be reflective to reflect light within the chamber 41 back to the area of optically transmissive member 40, so as to improve re-circulation of light within the chamber 41 and thereby improve overall optical performance of the light engine 31.

Although referred to as a phosphor, each nanowire may include one or more phosphors of different types where the mix of phosphors is chosen to promote a particular application of the apparatus 1. Another multi-phosphor approach might use a phosphor of one type in nanowires in one region of the chamber and a phosphor of another type in a different region of the chamber.

In both the examples of FIGS. 2D and 2E, the working fluid 51 may also be or include a phosphor or the like. If phosphor particles are contained in the fluid 51, the particle surfaces may be exposed to the fluid or the particles may be encapsulated in a barrier layer of a few nanometers up to around a micron, so long at the barrier layer does not substantially impede flow of light to or from the phosphor or flow of heat from the excited phosphor to the fluid medium. The phosphor in the working fluid 51 may enhance certain aspects of the light engine performance in a manner similar to that discussed above relative to the phosphor of the nanowires 56 in the example of FIG. 2D.

The examples of FIGS. 2D and 2E relate to different nanowire arrangements for one or more portions of the wicking structure. In both cases, the size and spacing of the nanowires would be such as to provide a capillary flow of the liquid form of the working fluid. The working fluid 51 would directly contact the outer surface(s) of the respective nanowires and thus at least some phosphor material within the nanowires 57 and/or the working fluid 51 would contain phosphor itself.

Thermal conductivity and phase transition heat transfer mechanisms that incorporate phosphor materials to be cooled by operation of the mechanisms under discussion herein can be used in a variety of different types of light emitting devices, apparatuses and systems. The light engine 31, for example, may be incorporated into various designs for light bulb type lamps; floor, desks or table lamps; light fixtures; displays; as well a lamps and fixtures for use in vehicles.

Figure 3:
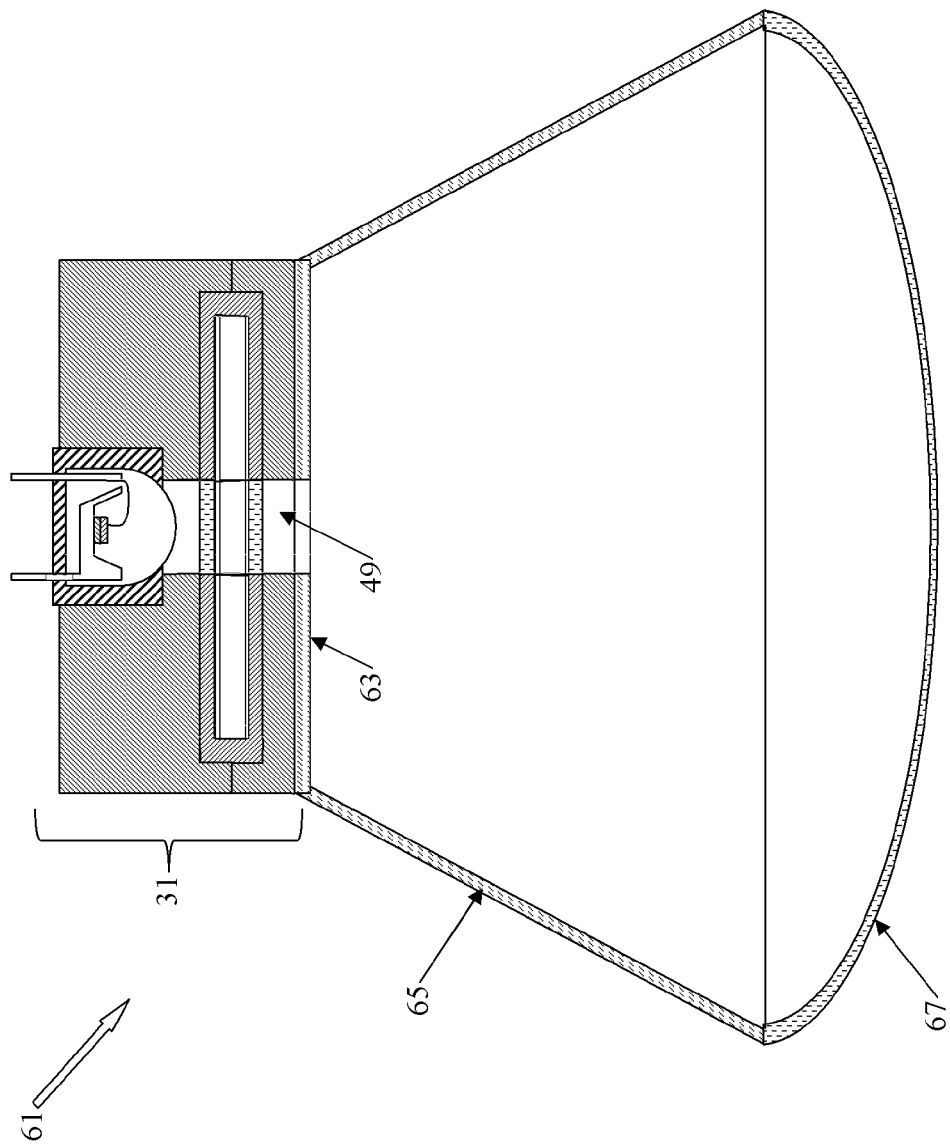
FIG. 3 is a cross-sectional view of an example of a light fixture incorporating a light engine like that shown in FIG. 2B.

To help illustrate, consider the simplified example of FIG. 3, which is a cross-sectional view of an example of a light fixture 61 incorporating a light engine 31 like that shown in FIG. 2B. The fixture 61 thus includes the light engine 31 for producing the light intended for output from the fixture 61 together with one or more passive optical processing elements, such as diffusers, reflectors, lens and the like, optically coupled to the output aperture or passage 49 of the light engine 31.

In the example, the additional passive optical processing elements coupled to the output aperture or passage 49 include a reflective coating or disk 63 on an output face of the light engine 31 and surrounding the optical output aperture 49 (through the second piece 37b of the heat sink 37 in FIGS. 2B and 2C). The passive optical processing elements of the fixture 61 also include a truncated conically shaped reflector 65 and a diffuser 67. The proximal end of the truncated cone of the reflector 65 connects to or matches with the outer periphery of the reflective coating or disk 63. The diffuser 67 is located at or near the distal end opening of the reflector 67.

The reflective surfaces of the reflective disk 63 and the reflector 65 may be specular, quasi-specular or diffusely reflective. Although shown as separate components, the reflective disk 63 and reflector 65 may be formed as a single unified reflective element. Also, the elements 63, 65 are shown as relatively flat cross-sectional shapes, although one or both may be curved or form angles. For example, the disk 63 and reflector 65 may be configured to form a parabolic reflector, to provide a more beam-shaped output of the fixture 61.

The surface of the diffuser 67 may be a translucent white material which passes and diffuse some light and tends to diffusely reflect some light back within the optical chamber formed by the reflective disk 63, the reflector 65 and the diffuser 67. If the reflective disk 63 and the reflector 65 are diffusely reflective, the chamber may perform at least some optical integration of light from the source and the phosphor before emission of light via transmission through the diffuser 67.

The disclosed fixture 61 may use a variety of different structures or arrangements for the disk 63, reflector 65 and diffuser 67. For efficiency, the reflective surfaces of the disk 63 and of the reflector 67 should be highly reflective. In the example, the light engine 31 is arranged in the fixture 61 so as to emit most of the light energy toward the diffuser 67. To increase the optical integration and reduce possible pixilation or striation, the light engine 31 is arranged in the fixture 61 so as to emit light toward a reflective surface in such a manner that direct emissions form the aperture 49 are not directed to a transmissive output portion of the fixture (not directly toward the diffuser 67 in our example).

The orientation in the drawing, in which light from the engine 31 is emitted downward, is shown only for purposes of illustration. Those skilled in the art will appreciate that the light fixture 61 may be used in any other orientation that is desirable or suitable for any particular application.

Fixtures of the type shown in FIG. 3 may combine the source, the reflector/diffuser elements and the thermal conductivity and phase transition heat transfer mechanism 35 that incorporates an opto-luminescent phosphor in a variety of other configurations. The remote phosphor may be provided in or about the optic formed by the source and the reflector/diffuser elements in any of a number of different ways or locations. For example, in another configuration, the thermal conductivity and phase transition heat transfer mechanism might have a reflective inner walled thermally conductive section with the phosphor deployed on the thermally conductive member and otherwise shaped like the combined reflector formed by 63 and 65 in the example of FIG. 3. Light reflected within the chamber would pump the phosphor and be reflected for passage through the diffuser 67.

As discussed, FIG. 3 represents an example of a light fixture. Although not shown, a lighting system that uses the engine 31 would include the engine and other elements forming the fixture or the like, in combination with appropriate electronics to drive the particular source 33. For example, if the source 33 includes one or more solid state light emitters, such as one or more LEDs, then the electronics would include a power supply for deriving DC power from the main source (DC battery or AC main lines) and driver circuitry for converting the derived DC to a form appropriate to drive the particular solid state emitter(s) at the output level appropriate for the intended lighting application. The power supply and driver circuitry are omitted from this and later examples for convenience, although those skilled in lighting will be quite familiar with such system components.

As noted earlier, the wicking structure may take various forms. The examples of FIGS. 2A to 3 utilized nanowire wicks. The use of nanowires in the wicking structure, particularly at the hot and cold locations, improves heat transfer.

In general, smaller more numerous heat transfer elements at these locations present increased surface area for heat transfer to/from the working fluid and therefore represent decreased thermal resistance. FIG. 4 is a comparative diagram useful in explaining how reducing the size and increasing the number of thermal elements per unit area of the housing wall increases total surface area for heat transfer and reduces the thermal resistance, both of which help to improve the rate of thermal transfer to/from the working fluid contacting the thermal transfer elements, in this case contacting the nanowires. It is believed that this comparison helps demonstrate and explain advantages of using nanowires or similarly sized elements in the wicking structure of the combined phase transition heat transfer mechanism of an optical/electrical transducer apparatus.

For discussion purposes, the square under each identifier (A), (B) and (C) represents a 2 mm×2 mm section of an inner surface of the vapor chamber of a thermal conductivity and phase transition heat transfer mechanism. However, the different examples (A), (B) and (C) have different sizes and numbers of heat transfer elements extending into the interior of the chamber. In the illustrated views, the heat transfer elements appear as circles, representing the end view (from inside the vapor chamber) of cylindrical heat transfer elements. Cylindrical shapes are used here for ease of modeling, although as noted earlier, other shapes may be used. For purposes of this comparison, we will assume that the heat transfer elements are all formed of same material in each and every one of the three examples of FIG. 4.

The first example (A) has four pins of radius 0.25 mm (diameter of 0.5 mm). The length of the pins L need not be specified for comparison purposes. The number 4 in the formulae for the example is the number of pins. The volume of each pin is $2\pi$ times the radius-squared times the length (L) of the pins. As shown, the total volume of the material of the four pins is $0.25^2*2\pi*L*4$, which equals 0.78L. For purposes of calculation of the surface area, we will use the outer cylindrical surface only (without including the end surfaces) to somewhat simplify the calculations for the comparison. With that approach, the surface area of a cylindrical pin is the diameter times $\pi$ times the length. Hence, the total cylindrical outer surface area presented by the four pins at (A) would be $0.5*\pi*L*4$, which equals 6.2L. The thermal resistance of each pin equals the pin radius times the thermal resistance R of the material from which the pins are formed. In the example (A) in which the radius of the pins is 0.25 mm, the thermal resistance of each pin is 0.25*R.

The second example (B) has sixteen (16) pins of radius 0.125 mm (diameter of 0.250 mm) of the same length L as in the previous example. As shown, the total volume of the material of the sixteen pins is $0.125^2*2\pi*L*16$, which again equals 0.78L. Again, using only the cylindrical surface area for purposes of comparison (without including the end surfaces), the total cylindrical outer surface area presented by the sixteen pins at (B) would be $0.25*\pi*L*16$, which equals 12.5L. This decrease in size and increase in number of pins results in approximately doubling the surface area for heat transfer in comparison to example (A). The thermal resistance of each pin in example (B), equals 0.125*R, which is half the thermal resistance of example (A).

The use of nanowires in the wicking structure, particularly in the vicinity of the hot location and/or the cold location 7, increases both the surface area for heat transfer and reduces the thermal resistance of each heat transfer element. Increased surface area and decreased thermal resistance both contribute to improved heat transfer. Example (C) in FIG. 4 represents a nanowire configuration in which the 2 mm×2 mm area of the chamber wall has $9.9 \times 10^9$ nanowires, where the radius of each nanowire is $5 \times 10^{-6}$ mm (5 nanometers) or the diameter of each nanowire is $10 \times 10^{-6}$ mm (10 nanometers).

As shown at (C), the total volume of the material of the nanowires is $(5 \times 10^{-6})^2 * 2\pi * L * (9.9 \times 10^9)$, which again equals 0.78L. Again, using only the cylindrical surface area for purposes of comparison (without including the end surfaces), the total cylindrical outer surface area presented by the nanowires at (C) would be $10 \times 10^{-6} * \pi * L * 9.9 \times 10^9$, which equals $(3.1 \times 10^5)L$, which is approximately 50,000 times more surface area for heat transfer than in first example (A). The thermal resistance of each nanowire in example (C), equals $(5 \times 10^{-6})*R$, which is approximately 50,000 times lower than the thermal resistance of example (A).

Hence, the use of nanowires in the wicking structure at various points in the exemplary light emitters discussed herein improves thermal transfer capabilities. At a hot location or interface, use of nanowires improves transfer of heat to the working fluid. At a cold location, use of nanowires improves transfer of heat from the working fluid to the cold interface, e.g. for transfer through the interface to a heat sink, active cooling element or ambient air.

The use of the nanowires also helps with the wicking action. As noted, inter-molecular forces between a liquid and the surface(s) of the wicking material around the liquid produce capillary action to move of the liquid form of the working fluid along or through the material. Increasing the surface area helps to increase the inter-molecular forces on the liquid form of the working fluid. Hence, use of nanowires as the wicking structure, with the increased surface area as shown above, also increases the strength of the capillary action of the wicking structure on the liquid form of the working fluid.

As noted earlier, a variety of different fluids may be used as the working fluid. Different fluids are used in various light emitting devices or engines to support the heat transfer function. In some examples noted above, the working fluid also serves as a carrier for phosphor. In several examples discussed later, the working fluid may also serve as a conductor (with or without include phosphor). For a working fluid that would carry semiconductor nano-phosphor as the phosphor, examples of suitable fluids include acetone, methanol, ethanol and toluene. If the nano-phosphor is well encapsulated, water may be on option. Toluene may be a preferred choice for many phosphors, however, for cooler internal working temperatures, ethanol me be preferred. For a working fluid that would carry rare-earth-phosphor, examples of suitable fluids include acetone, methanol ethanol and toluene, although here water may be a preferred choice. For a working fluid that is also electrically conductive, examples of suitable fluids include salt water, ammonia and fluids from the class of transparent ionic liquids.

The example of FIG. 3 related to use of a thermal conductivity and phase transition heat transfer mechanisms that incorporate phosphor materials to be cooled by operation of the mechanism in a light fixture. As noted, such mechanisms may be utilized in other devices for emitting light, including in lamps. It may be helpful to consider an example of a lamp product that conforms to a fairly common form factor, specifically, the form factor of an A-lamp.

Figure 5:
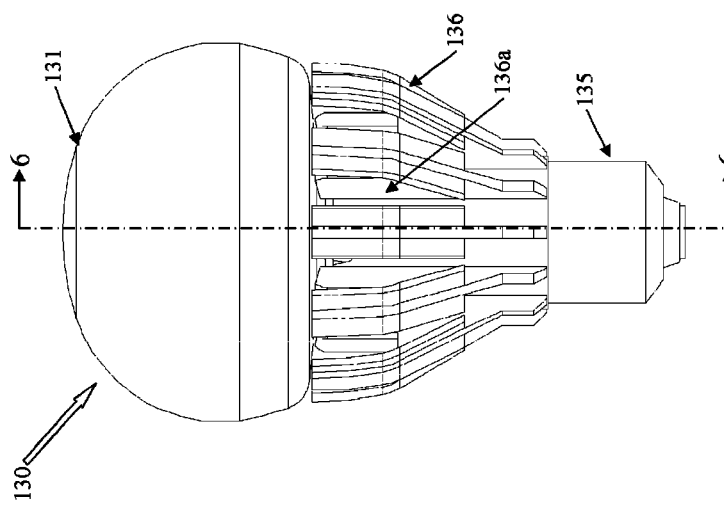
FIG. 5 is a side view of an example of a lamp, for lighting applications, which uses solid state light emitters and a phosphor in a thermal conductivity and phase transition heat transfer mechanism to produce white light.

FIG. 5 illustrates an example of a solid state lamp 130. The exemplary lamp 130 may be utilized in a variety of lighting applications analogous to applications for common incandescent lamps and/or compact fluorescent lamps. The lamp 130 includes solid state light emitters 132 for producing lamp output light of a desired characteristic, from the emitter outputs and from luminescent phosphor emissions driven by the emitter outputs as discussed more fully below. The solid state emitters as well as the other components within the bulb 131 are visible in the cross-sectional view of FIG. 6.

At a high level, a lamp 130 includes solid state light emitters 132, a bulb 131 and a pedestal 133. The bulb 131 may be either transparent or diffusely transmissive. The pedestal 133 extends into an interior of the bulb 131 and supports the solid state light emitters 132. In the example, the pedestal is attached to the hot interface of a thermal conductivity and phase transition heat transfer mechanism in the form of a shaped tubular heat pipe 138, although the pedestal may be formed as an integral portion of the heat pipe 138.

The pedestal 133 may be cylindrical in cross-section with one or more emitters 132 mounted on the distal end face of the cylinder and others of the emitters mounted around the cylindrical longitudinal surface. Alternatively, the pedestal 133 may have a polygonal cross-section with several outward facing surfaces. Again, one or more emitters 132 would be mounted on the distal end face of the pedestal 133; and one or more of the emitters 132 would be mounted on each of the outward facing surfaces of the polygonal shaped pedestal. The drawing illustration in represents a pedestal with a somewhat triangular cross section have three major surfaces facing laterally outward in three different orientations, each for supporting one or more emitters 132. The orientations of the solid state light emitters 132 from the end face and the lateral surface(s) of the pedestal 133 produce emissions through the bulb 131 that approximate light source emissions from a filament of an incandescent lamp.

The orientation in the drawings, in which the bulb 131 is at the top and much of the light emissions form the lamp are horizontal and upward about a vertical central axis of the lamp 130, is shown only for purposes of illustration. Those skilled in the art will appreciate that the lamp may be used in any other orientation that is desirable or suitable for any particular application of the transducer apparatus.

In this example, a thermal conductivity and phase transition heat transfer mechanism 134 that incorporates a phosphor to be cooled by operation of the mechanism is positioned radially and longitudinally around the solid state light emitters 132 supported on the pedestal and between an inner surface of the bulb 131 and the solid state light emitters 132. The mechanism 134 is formed of a thermally conductive section and an optically transmissive member and contains phosphors in a manner similar to the examples of FIGS. 1-4 (and as will be described in more detail, later, with regard to FIGS. 7 and 8). In contrast, the housing of the heat pipe 138 is entirely formed of thermally conductive material and is not optically transmissive; and the heat pipe 138 need not include any phosphor.

The lamp 130 also includes a heat sink 136. A straight section 138a of the heat pipe 138 supports the pedestal 133 with the light emitters 134 and provides the hot interface for the light emitters. A spiral straight section 138a of the heat pipe 138 is mechanically connected to an interior wall of the heat sink 136, to provide structural support and to provide the cold interface for transfer of heat out of the heat pipe to the heat sink 136.

The heat sink 136 has a modular-coupling for attachment of one of a number of different lighting industry standard lamp bases 135. The heat sink 136 also has a second modular-coupling for attachment of one of a number of different types of bulbs 131 and a third modular-coupling for attachment of one of a number of different types thermal conductivity and phase transition heat transfer mechanism 134. Although they may differ somewhat as to shape, e.g. in the region around the emitters 132 on the pedestal 133, the different types of the mechanism 134 typically will have different mixtures of one or more phosphors with the mechanisms, so that different instances of the lamp 130 will produce white light output of somewhat different spectral characteristics, e.g. different color temperatures and/or different levels of white light color quality. The base, heat sink and bulb also enclose circuitry on a circuit board (not shown) inside the coil 138b of the heat pipe 138, to receive electricity from the lamp base 135, for driving the solid state emitters 132 of the source to emit the light.

The solid state light emitters 132 in the exemplary lamp may be driven/controlled by a variety of different types of circuits. Depending on the type of solid state emitters selected for use in a particular lamp product design, the solid state emitters may be driven by AC current, typically rectified; or the solid state emitters may be driven by a DC current after rectification and regulation. The degree of control may be relatively simple, e.g. ON/OFF in response to a switch, or the circuitry may utilize a programmable digital controller, to offer a range of sophisticated options. Intermediate levels of sophistication of the circuitry and attendant control are also possible.

The modular couplings facilitate use of certain common components that form a light engine together with different bulbs 131, bases 135 and/or inner mechanisms 134 with different phosphors for different lamp configurations. The common components forming the engine may include the pedestal 133, the emitters 132, the heat pipe 138 and the heat sink 136.

In the example, the pedestal 133 on the straight section 138a of the heat pipe 138 extends from the heat sink 136 along the longitudinal axis of the light engine/lamp into a region to be surrounded by the bulb 131 when attached to the heat sink member at the first modular-coupling. The heat pipe 138 and the pedestal 133 provide heat conductivity to the heat sink 136 as well as support from the heat sink 136, for the light emitters 132. The portion of the straight section 138a of the heat pipe 138 serves as the hot interface to receive heat from operation of the light emitters 132 via the thermally conductive material forming the pedestal 133. The coil section 138b of the heat pipe 138 as the is mechanically and thermally coupled to the interior wall of a core of the heat sink 136 and serves as the cold interface for transfer of heat out of the pipe 138 to the heat sink 136. The heat sink 136 in turn dissipates the heat, e.g. to ambient atmosphere. Although not shown, air passages may also be provided through the coupling of the heat sink to the bulb and or to/from the interior of the inner optical processing member to allow flow of air around the emitters and venting thereof to the exterior of the lamp 130.

Figure 6:
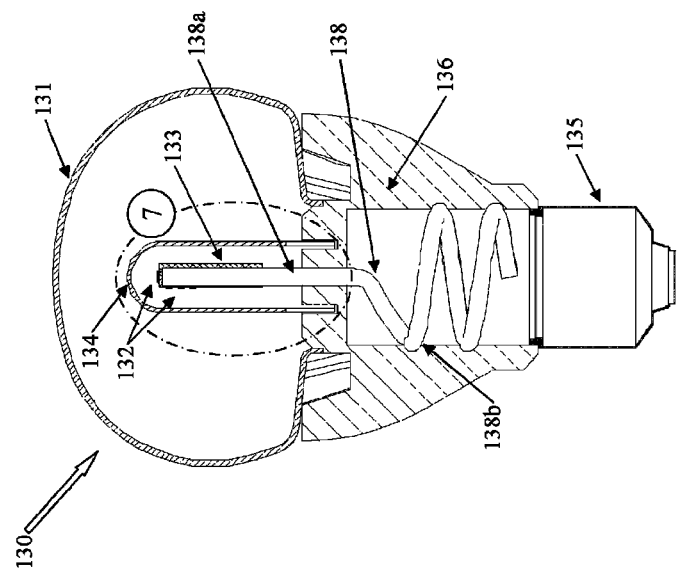
FIG. 6 is a cross-sectional view of an example of the lamp of FIG. 5, taken along line 6-6 of FIG. 5.

In the example of FIGS. 5 and 6, the heat sink fins 136a have an outward curved or slightly angled profile at their outer edge. The heat sink 136 may also includes flares on the fins extending in a somewhat circumferential manner. If provided, the flares may be located between the proximal and distal ends of the fins 136a or at the distal ends of the fins 136a. The flares may follow the outer curvature of the fins 136a or the flares may be curved inward (as opposed to the outer curve at the perimeter of the fins). Longitudinally, the length of the fins 136a extends from the bulb 131 down to the base 135. Various fin and flare designs may be used. For a given lamp design, the fins and flare will generally be configured to provide good heat dissipation to the ambient atmosphere but may also be configured to allow some light passing outward through the bulb 131 to pass through the gaps between the fins and thereby provide a some output for the lamp 130 downward in the illustrated orientation.

The solid state lamps in the examples produce light that is at least substantially white. In some examples, the solid state emitters 132 produce light that is at least substantially white but at a first color temperature (FIG. 13B), and phosphor(s) in the mechanism 134 converts some of that light so that the lamp output is at least substantially white but at a second color temperature. In other examples, the solid state emitters 132 produce light that would not normally be considered white but is particularly effective at pumping phosphors in the mechanism 134 so that the overall lamp output is at least substantially white. In these various examples, light is at least substantially white if human observers would typically perceive the light in question as white light. The types of phosphor or phosphor used are the same as discussed above, e.g. with respect to the example of FIG. 1.

The solid state light emitters 132 are semiconductor based structures for emitting light, in some examples for emitting substantially white light and in other examples for emitting light of color in a range to pump phosphors. In the example, the light emitters 132 comprise light emitting diode (LED) devices, although other semiconductor devices might be used as the source.

As noted, the thermal conductivity and phase transition heat transfer mechanism 134 that incorporates the phosphor may be constructed in a manner similar to the examples of FIGS. 1-4, although as shown in FIGS. 6 and 7, the mechanism is shaped to fit around and be somewhat separated from the pedestal 133 and the LED type solid state light emitters 132. It may be helpful to discuss the example of the mechanism 134 in somewhat more detail with reference to the enlarged views of FIGS. 7 and 8. FIG. 7 shows the portion of lamp cross-section encompassed by the oval 7 in FIG. 6, including the thermal conductivity and phase transition heat transfer mechanism 134 and the coupling thereof to the heat sink 136; whereas FIG. 8 shows portions of the walls and wicks for the thermally conductive housing section and the optically transmissive members encompassed by the circle 8 in FIG. 7.

As in the earlier examples, the mechanism 134 includes a housing 146 having a section 148 that is thermally conductive and two members 149 and 150 that are at least partially optically transmissive. Although other shapes or configurations may be used, the example of FIGS. 7 and 8 utilizes a cylindrical configuration with a dome at the distal end, for each of the optically transmissive members 149 and 150. The optically transmissive member 150 is somewhat smaller than the optically transmissive member 149, and the members 149, 150 are attached to the housing section 148 so as to be concentric. In this way, a space is formed between the optically transmissive members 149 and 150. The thermally conductive section 148 of the housing 148 is cylindrical in this example, having two concentric cylindrical walls 148a, 148b joined by a flat section 148c at the proximal end of the section 148. The walls 148a and 148b and the flat section may be formed as a single integral member or manufactured separately and bonded together by welding, soldering or the like. The cylindrical wall 148b is somewhat smaller than the cylindrical wall 148c, and the attachment through the flat section 148c positions the two walls so as to be concentric. In this way, the two concentric cylindrical walls 148a, 148b are separated by a space similar to the space between the optically transmissive members 149 and 150. The inner area at the proximal end of the section 148 provides an opening for coupling to the heat sink 136. The optically transmissive members 149, 150 are attached to the housing section 148 to form a seal for a vapor tight chamber 151. For example, if the optically transmissive members 149, 150 are formed of a glass or ceramic material and the housing section 16 is formed of a metal, the different elements may be joined by a glass frit process or by application of a suitable epoxy. The materials and the thermal and optical properties of the housing section 148 and the members 149, 150 forming the housing 146 can be similar to those discussed above relative to similar elements in the example of FIG. 1.

The heat sink 147 in this example is made of a highly thermally conductive material, typically a metal such as aluminum or copper, although other thermally conductive material materials, such as thermally conductive plastics and ceramics. The distal end (upper in FIG. 6) of the heat sink 136 is configured to provide a central axial passage 152 for the straight section 138a for mechanical connection and thermal coupling of the heat pipe 138 to the heat sink 138. The passage 152 may be only slightly larger in diameter than the outer diameter of the straight section 138a to provide a tight fit, or the straight section 138a may be bonded into the passage 152, e.g. welding, soldering, epoxy or the like.

The distal end of the heat sink 136 is configured to provide a modular coupling for the thermal conductivity and phase transition heat transfer mechanism 134, which contains the phosphor. Although other coupling arrangements may be used, in the example, the coupling takes the form of a circular groove or indentation 154. The distal portion of the housing section 148 is mounted in the matching circular groove 154 formed in the distal end of the heat sink 136. Although it may be somewhat deeper than necessary, the lateral dimensions of the groove 154 provide a width between the inner and outer walls of the groove that is only slightly larger than the width of the housing section (from outside surface of wall 148a to opposite outside surface of wall 148b). The housing section 148 of the mechanism 134 may be press fitted into the groove 154 and/or bonded to the heat sink, for example, by welding, soldering, epoxy or the like.

The mounting of the housing section 148 in the groove 154 provides structural support for the mechanism 134 and provides good thermal conductivity for the flow of heat from the housing section 148 to the surrounding portion of the heat sink. This thermal connection provides a cold interface for the thermal conductivity and phase transition heat transfer mechanism 134.

As in the example of FIG. 1, the mechanism or device 134 also includes an opto-luminescent phosphor contained within the chamber 157 for emitting light when excited by optical pumping energy from the source 143. The phosphor is the active optical element of the mechanism or device 134; although the lamp includes the source (another active optical element) formed by the emitters 132 which are external with respect to the mechanism and the phosphor therein, as well as a passive optical element in the form of the bulb 131. The particular phosphor of one or more different types is similar to the phosphor discussed above relative to FIG. 1.

The arrangement of the phosphor in the mechanism or device 134 separate from the emitter 132, with optical coupling there between, provides a form of "remote" deployment of the phosphor relative to the source formed by the emitters 132 in that the phosphor is outside of the package enclosing the actual semiconductor chip of each solid state light emitter 132 and thus is apart or remote from the actual light emitter (s). The housing 148 containing the phosphor may be located at any convenient distance in relation to the light output of the source 143. For example, there may be a larger or smaller separation than that shown between the emitters 132 and the nearest optically transmissive member 150.

Again, the phosphor may be provided in the chamber 151 in a variety of different ways, including some ways outlined above. For example, the phosphor may be provided in the mechanism 134 as a layer formed on the inner surface of either one or both of the optically transmissive members 149, 150, similar to the layer 17 in the example of FIG. 1. Another approach to the phosphor deployment would be to include the phosphor in the working fluid 161. The mechanism 134 in the example also includes a wicking structure 160 mounted within the chamber 151 to facilitate flow of the condensed liquid of the working fluid from the cold location(s) to the hot location of the mechanism 134. The example of FIG. 8 incorporates the phosphor in the wicking structure, in a manger similar to the arrangement described above with respect to FIG. 2D.

As in the earlier example, a portion of the chamber 151 within the housing section 148 will form a cold location 163 within the chamber 151, and the housing section 148 in that location forms a cold interface for transfer of heat to the heat sink 136. In the example of FIGS. 7 and 8, the cold location 163 is formed around the portion of the chamber 151 at the proximal end of the mechanism 134, that is to say, in the portion of the chamber inside the proximal end of the housing section 148, such that the part of the housing section 148 connected to the heat sink 136 serves as the cold interface. The relatively hot location 165 is the chamber 151 in the region(s) around the emitters 132 on the pedestal 133 between the optically transmissive members 149, 150. Phosphors in the wicking structure and/or fluid at 165 would be at the hot location from which the thermal conductivity and phase transition heat transfer mechanism 134 transfers heat.

As noted, the exemplary mechanism 134 also includes a working fluid 161 within the chamber 151. The working fluid 161 is directly in contact with at least a portion of the opto-luminescent phosphor, in this example, within the wicking structure on one or both of the optically transmissive members 149, 150. The pressure within the chamber 151, typically a pressure somewhat lower than atmospheric pressure, configures the working fluid 161 to absorb heat during operation of the lamp 111, including heat from the phosphor produced by phosphor excitation and/or received from the solid state light emitters 132. The working fluid 161, in its liquid state, contacts the hot interface at the location 165 where the mechanism 134 receives or produces heat. In the example, the working fluid directly contacts at least some surface area(s) of the phosphor at or near the hot location 165. When heated at the relatively hot location 165, the working fluid 161 vaporizes. The vapor fills the chamber 151 and condenses at the cold location(s) 163. At the cold location(s) 163, heat is transferred from the vapor to the wall of the section 148 of the housing and from there to the heat sink 136 for dissipation to the ambient environment, typically to the atmosphere. The transfer of heat to the housing section 148 causes the vapor to condense back to the liquid form, at the relatively cold location(s) 163. Through the capillary action of the wicking structure 160, the liquid form of the working fluid 161 flows to the relatively hot location 165 around the emitters 132. A variety of different fluids may be used as the working fluid, and the pressure is determined based on the fluid type and the amount of heat that the fluid is expected to transfer.

As in the earlier examples, the wicking structure 160 may take many forms, such as sintered metal, phosphor, glass or ceramic powder; woven copper; surface grooves, mesh arrangements or small closely spaced wires extending inward from the surfaces of the housing forming the walls of the chamber 151; as well as nano-scale wire structures extending inward from the chamber surface(s); and various combinations of these forms. The spacing between elements of the wicking structure 160 is sufficiently small to cause intermolecular forces on the liquid form of the working fluid 161 to cause the liquid to flow toward the region where the fluid vaporizes, that is to say, the hot location 165 in the mechanism 134. This wicking or capillary action enables the liquid form of the working fluid to flow back to the hot location regardless of the orientation of (and thus the impact of gravity on fluid in) the heat transfer mechanism 134.

In the example of FIG. 8, the mechanism 134 uses wicks for the structure 160 that utilize nanowires. A wick 162 formed on the inner surface of one or both of the optically transmissive members 149 and 150 utilizes nanowires that also include the phosphor, essentially like the nanowires in the example of FIG. 2D. The wick 164 formed on the inner surfaces of the thermally conductive housing section 148 in the example are metallic nanowires, which may be reflective, similar to the nanowire wick in the example of FIG. 2E. AS in the earlier example phosphors of multiple types may be provided, in the wick 162, in different sections of the wick 162 or in the wick 162 and the working fluid 161.

In operation, light energy from the emitters 132 pass through the optically transmissive members 149, 150. Some of that energy in an excitation band of the phosphor in the mechanism 134 excites the phosphor to emit light in an emission band that is at least somewhat different from the energy that excited the phosphor. Light produced by the phosphor excitation also passes through the optically transmissive members 149, 150. The combined light output of the lamp 130 through the bulb 131 typically will include some light from the emitters 132 as well as light produced by excitation of the phosphor. For example, the phosphor may convert some energy from a less desirable wavelength range (e.g. near or outside the visible spectrum) to a more desirable wavelength range (e.g. near or outside the visible spectrum) to a more desirable wavelength range (e.g. to fill-in a gap in the spectrum of the output of light engine 31 and/or to improve the quality of the light output).

Figure 9:
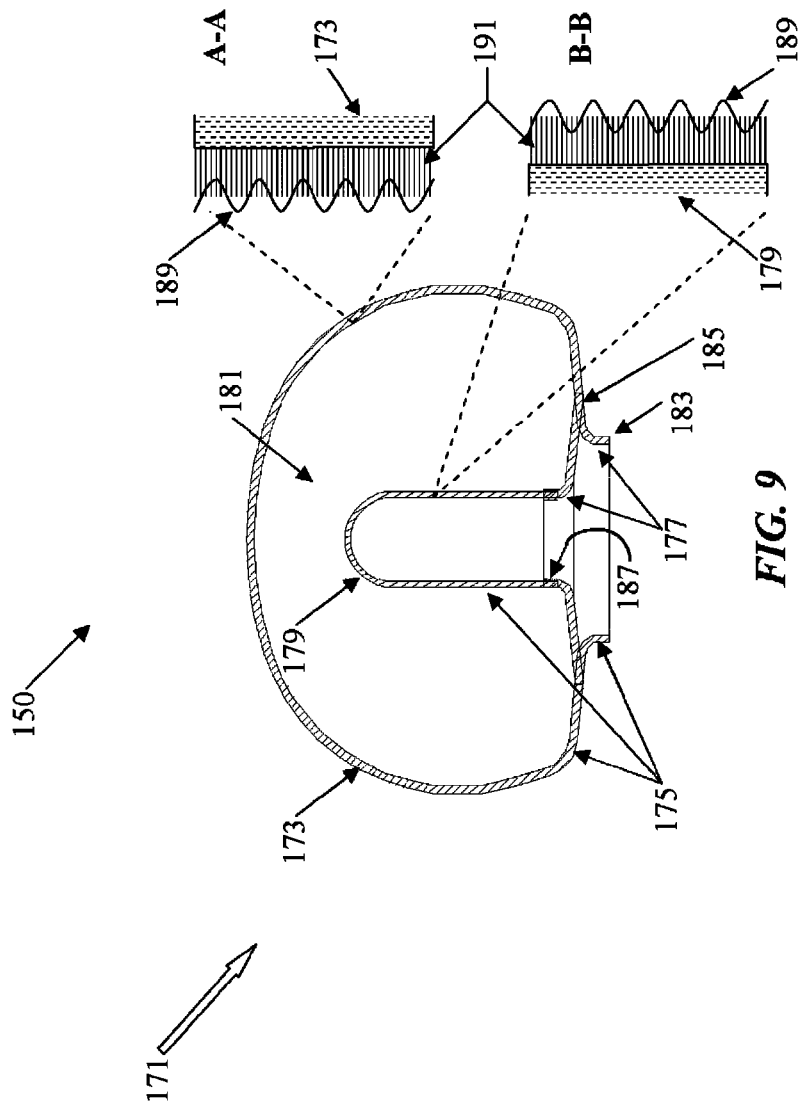
FIG. 9 is a cross-sectional view of an alternate example of a thermal conductivity and phase transition heat transfer mechanism which may be used with other components similar to those of FIGS. 5 and 6 to form a lamp.

FIG. 9 shows an alternate example of a thermal conductivity and phase transition heat transfer mechanism, which may be used with other components similar to those of FIGS. 5 and 6 to form a lamp. Instead of a separate mechanism 134 and bulb 131 as in the lamp of FIGS. 5 and 6, the mechanism 171 uses a transmissive member 173 to serve both as one of the optically transmissive members of the mechanism and as the outer bulb of the lamp.

As in the earlier examples, the mechanism 171 includes a housing 175 having a section 177 that is thermally conductive and two members 173 and 179 that are at least partially optically transmissive. The housing section 177 and the optically transmissive members 173 and 179 may be formed of materials and joined together to form a vapor tight chamber 181, as in the earlier examples.

In this example, the thermally conductive housing section 177 is configured to connect with the modular coupling region of the heat sink 136 used for connection of the bulb in the example of FIG. 6. For that purpose, the section 177 has a downwardly extending circular boss 183 that mates with a corresponding groove or shoulder formed in the upper region of the heat sink.

The housing section 177 also is configured for connection to the two optically transmissive members 173 and 179. The periphery 185 of the housing section 177 mates with a circular inner opening on the lower portion of the optically transmissive member 173. The housing section 177 also includes an upwardly extending circular boss 185 that mates with the lower or proximal end of the inner optically transmissive member 179.

When assembled and mounted on the heat sink, the inner optically transmissive member 179 is positioned around the straight section of the heat pipe, the pedestal and the light emitters in a manner similar to the mechanism 134 in the lamp example of FIG. 6. The outer optically transmissive member 173 is positioned around the member 179 and the other lamp elements in a manner similar to the bulb in the lamp example of FIG. 6. However, the connections of the members 173, 179 to the housing section 177 form a sealed vapor chamber 181 for the thermal conductivity and phase transition heat transfer mechanism 171 in the space between the members 173 and 179. The circular boss 183 of the housing section 177 is securely mounted on and/or bonded to the mating upper portion of the heat sink, to provide structural support for the mechanism 171 as well as to provide good thermal conductivity from the cold interface provided through the housing section 177 to the heat sink.

As in the earlier examples, the exemplary mechanism 171 also includes a working fluid 189 within the chamber 181. The fluid 189 is a suitable type like, one of the fluids discussed earlier. The working fluid 189 is directly in contact with at least a portion of the opto-luminescent phosphor, in this example, within the wicking structure 191 on one or both of the optically transmissive members 173, 179. As in the previous lamp example, phosphor is provided in the wicking structure 191 on one or both of the optically transmissive members 173, 179, that is to say, in the same manner as in the wick discussed above relative to FIGS. 7 and 8. Phosphor may also be provided in the working fluid 189. Detail A-A in FIG. 9 represents an enlarged cross-sectional view of a portion of the optically transmissive outer member 173 with a section of the phosphor bearing wick 191 on the inner surface. Detail B-B in FIG. 9 represents an enlarged cross-sectional view of a portion of the inner optically transmissive member 179 with a section of the phosphor bearing wick 191 on the outer surface.

Although not specifically shown, the wicking structure within the chamber 181 also includes a wick formed on the inner surface(s) of the thermally conductive section 177. The wick on the section 177 may take any of the various forms discussed early, although for purposes of discussing a specific example, we will assume that the wick on the section 177 is formed of metallic nanowires which may be at least somewhat reflective, e.g. similar to the metallic nanowire wick discussed above relative to FIG. 2E.

The electrical and optical operations of the lamp that incorporates the mechanism 171 with the phosphor are essentially the same as those of the lamp of FIGS. 6-8. As in the other exemplary mechanisms, the pressure within the chamber 181, configures the working fluid 189 to absorb heat during operation of the lamp that utilizes the mechanism 171, including heat from the phosphor in the wicking structure 191 and any phosphor that may be provided in the working fluid, produced by phosphor excitation and/or received from the solid state light emitters. The working fluid 189, in its liquid state, contacts the hot interface at the location around the upper distal end of the inner optically transmissive member 179 where the mechanism 134 receives or produces heat. In the example, the working fluid directly contacts at least some surface area(s) of the phosphor at or near the hot location and/or contains some of the phosphor(s). When heated at the relatively hot location, the working fluid 189 vaporizes. The vapor fills the chamber 181 and condenses at the cold location(s) at or around the inner surface of the thermally conductive section 177. At the cold location(s), heat is transferred from the vapor to the wall of the section 177 of the housing and from there to the heat sink for dissipation to ambient environment, typically to the atmosphere. The transfer of heat to the housing section 177 causes the vapor to condense back to the liquid form, at the relatively cold location(s). Through the capillary action of the wick structure 191 and the wick (not shown) on the section 177, the liquid form of the working fluid 189 flows to the relatively hot location.

The exemplary lamps discussed with respect to FIGS. 6-9 produce a substantially omni-directional light output from the bulb or from the outer optically transmissive member, including through gaps or spaces between the heat sink fins. The principles under consideration here, however, are readily adaptable to other forms of lamps or fixtures providing different types of desired light output distributions. FIGS. 10-13B relate to a fixture of lamp where the one optically transmissive member of the various thermal conductivity and phase transition heat transfer mechanism that incorporates the phosphor also forms a directional optic, enabling the lamp or fixture utilizing the illustrated light emitting device to provide a field of output illuminated that is somewhat angularly limited.

Figure 11:
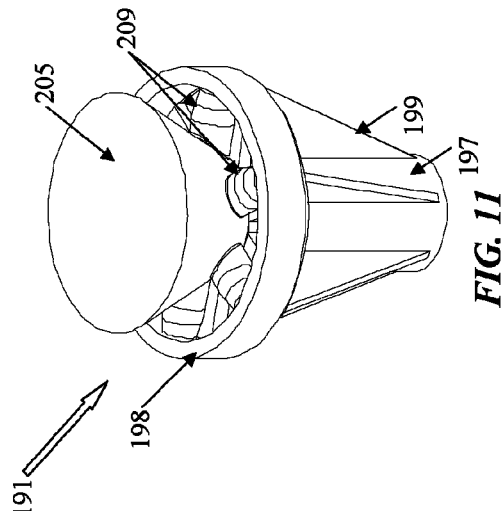
FIGS. 10, 11 and 12 are top, isometric and side/plan views of a light emitting device with emitters, a mechanism containing phosphor, a heat sink and passive optical elements, for use in a fixture or lamp/light bulb for a more directed lighting application.
Figure 13B:
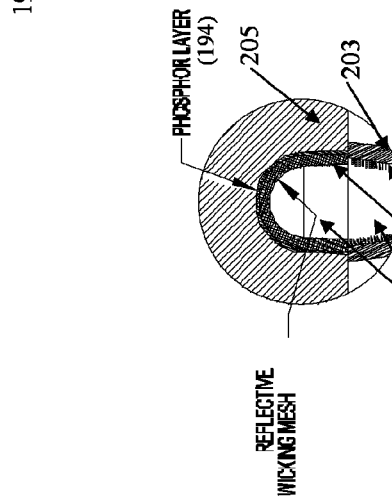
FIG. 13B is an enlarged detail view of a portion of the thermal conductivity and phase transition heat transfer mechanism that incorporates the phosphor and a portion of the optic, encircled by the arrow B in FIG. 13A.
Figure 13A:
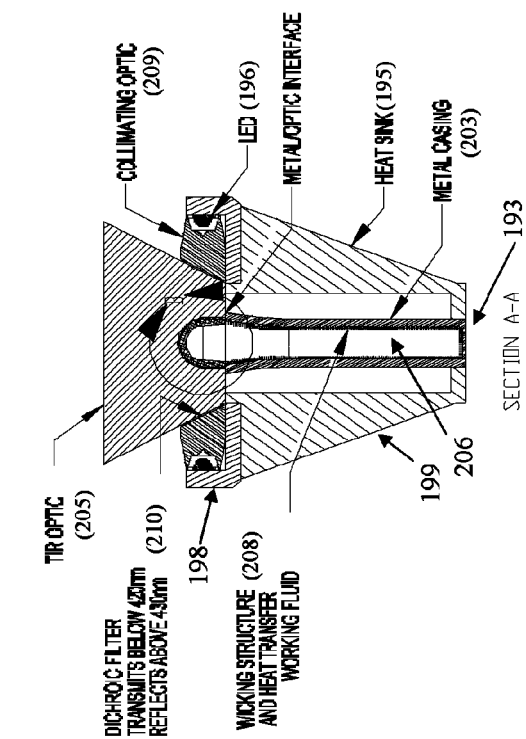
FIG. 13A is a cross-sectional view taken along line A-A of FIG. 12.
Figure 10:
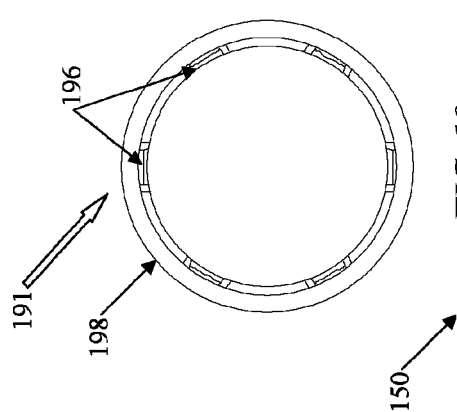
Figure 12:
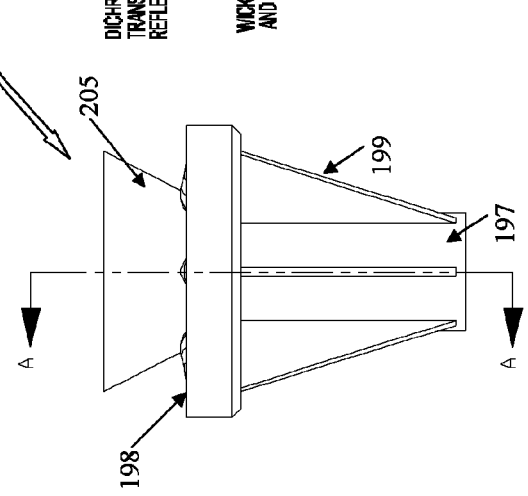

FIGS. 10, 11 and 12 are top, isometric and side/plan views of the light emitting device 191; and FIG. 13A is a cross-sectional view of the device 191, and FIG. 13B is an enlarged view, showing details around the portion of the thermal conductivity and phase transition heat transfer mechanism 193 that incorporates a layer of phosphor 194. Like the lamp 131 discussed earlier, the device 191 utilizes light emitting diodes (LEDs) 196 that serve as the source of optical energy for pumping the phosphor 194 within the mechanism 193. In the example, there are six LEDs 196, although there may be fewer LEDs or more LEDs, depending on the amount of optical energy required for a particular design/application for the device 191. In addition to the LEDs 196 and mechanism 193 with the included phosphor 194, the light emitting device 191 includes a heat sink 195 and a number of passive optical elements, to configure the device 191 for use in a fixture or lamp/light bulb for a more directed lighting application. One of the passive optical elements, the total internal reflection optic, also serves as the optically transmissive member 205, as discussed in more detail, later.

As in the earlier examples, the light emitting device 191 may operate at any orientation, although a particular orientation is illustrated for convenience. Some aspects of the following description of the light emitting device 191 use directional terms corresponding to the illustrated orientation, for convenience only. Such directional terms but are not intended to be limiting in any way.

As illustrated, the mechanism 193 in the light emitting device 191 includes a housing having a section 203 that is thermally conductive and a member 205 that is at least partially optically transmissive. Although shown by way of example as a metal casing in FIG. 13A, as in the earlier examples, the thermally conductive section 203 of the mechanism housing may be made of a variety of other thermally conductive materials.

The thermally conductive section 203 consists of a hollow metal cylinder or tube having a circular cross-section. A substantial portion of the metal section 203 of the housing extends down into a hollow space and a proximal passage through the core 197 of the heat sink 195. The copper section 203 may be press fitted into the passage or be otherwise connected and thermally coupled to the heat sink 195 in any appropriate manner suitable for efficient heat transfer and to provide structural support that may be necessary for the apparatus 193. The end of the copper cylinder or tube of section 203 opposite the optically transmissive member 205 is closed, e.g. by a flat circular section of the metal casing.

The heat sink 195 is formed of a highly thermally conductive material, typically a metal such as copper or aluminum, although other materials, such as thermally conductive plastics and ceramics, may be used. The heat sink 195 in this example has a core 197 and radially extending fins 199. Straight radial fins are shown at 199, for convenience, although other shapes/contours may be used for the fins, e.g. to improve transfer of heat to the ambient atmosphere.

The heat sink core 197 has a cylindrical central hollow space surrounding most of the housing section 203, although in this example, the wall of the central space does not directly contact the housing of the mechanism 193. A proximal end (lower end in the drawings) of the heat sink 193 closes the hollow space in the core except for a central passage, a wall of which forms a fairly tight structural and thermal connection to the outer surface of proximal end of the thermally conductive section 203 of the housing of the mechanism 193. A more extensive close fitting connection between the heat sink 195 and more or all of the length of the housing section 203 could be provided. As noted, the housing section 203 may be press fitted into the central passage or bonded to the heat sink 195, for example by soldering, welding or an appropriate adhesive.

The connection of the housing section 203 in the passage through the proximal end of the heat sink core provide structural support for the housing section 203 as well as thermal conductivity from the mechanism 193 to the heat sink 195. The connection thus configures the proximal end of the housing section 203 as the cold interface of the thermal conductivity and phase transition heat transfer mechanism 193.

In this example, the optically transmissive member 205 is itself a passive optical processing element, formed of a material and shaped to provide total internal reflection (TIR) with respect to light passing through the material of the optic impacting at certain angles with respect to surfaces of the TIR optic formed by the member 205. The example shows the member in the shape of a truncated circular cone with a tapered conical outer lateral surface, and a flat circular distal end surface, although other shapes may be used. The member 205 may be formed of glass, plastic or other similar materials of appropriate optical properties.

A separate member could be used as the optically transmissive member, and the TIR optic would be fitted over the separate member. However, in the illustrated example, the material of the TIR optic also serves the optically transmissive member 205 of the thermal conductivity and phase transition heat transfer mechanism 193. As shown in FIGS. 13A, 13B with the TIR optic/member 205, a hollowed portion of the optic forms a portion of the inner wall of the housing and thus part of the chamber 206 of the thermal conductivity and phase transition heat transfer mechanism 193. It should be noted that the detail view of FIG. 13B represents only the portion of the optic/member 205 encircled by the arrow B-B and does not show the entire TIR optic 205 (compare to FIG. 13A).

In this example, the optically transmissive member 205 has a hollow cylinder or tube formed within the material of the TIR optic 205 for forming the vapor chamber 206 when joined to the housing section 203. The hollow section has a circular cross-section and is closed at one end by a curved or dome-shaped contour within the glass, although other shapes for this chamber section could be used. The interior of the cylindrical thermally conductive section 203 and the hollow within the optically transmissive member/optic 205 have approximately the same lateral dimensions so as to form a relatively straight continuous cylindrical volume for the vapor chamber 206 within the housing.

The optically transmissive member 205 is connected to the metal casing that forms the thermally conductive section 203 to form a housing enclosing the vapor chamber 206 and the phosphor 194. Specifically, the section 203 and member 205 are connected so as to form a vapor tight seal for the chamber 206. Depending on the materials used for components 203 and 205 of the mechanism, the two components 203 and 205 may be joined by a glass fit process or by application of a suitable epoxy, at the metal/optic interface.

The thermal conductivity and phase transition heat transfer mechanism 193 also includes an opto-luminescent phosphor 194 contained within the chamber 206 for emitting light when excited by optical pumping energy. In this example, the phosphor takes the form of a layer at 194 formed on the inner surface of the hollowed portion of the TIR optic/member 205 that forms a portion of the inner wall of the chamber 206 within the optic 205. The phosphor 194 is the active optical element of the mechanism 294. The material of the phosphor 194 is the same as discussed above with regard to earlier examples. The heat transfer function of the mechanism 193 mitigates thermal impact on the phosphor 194.

The thermal conductivity and phase transition heat transfer mechanism 193 also includes a working fluid, of one of the types discussed in the earlier examples. The working fluid, in its liquid state, contacts the hot interface at the location where the apparatus receives or produces heat. In the example, the working fluid directly contacts at least some surface area(s) of the phosphor layer 194 through the wicking structure at or near the hot location. At those surface areas, the working fluid absorbs at least some heat from the phosphor 194, be it heat generated by excitation of the phosphor or heat the phosphor may receive from the operation of the LEDs 196.

As in the earlier examples, the device 191 of FIGS. 13-15 includes a wicking structure 208 mounted within the chamber 206 to facilitate flow of condensed liquid of the working fluid from the cold location to the hot location. Together, the housing, the chamber, the working fluid and the wicking structure form a thermal conductivity and phase transition heat transfer mechanism 193 for transferring heat away from the phosphor 194. In this case, with the phosphor 194 formed as a layer on the inner surface of the optic/member 205, light from the emitters that passes through the phosphor as well as light emitted toward the chamber 206 by phosphor excitation should be directed out through the optic/member 205. For that purpose, at least the portion of the wicking structure formed on the inner surface of the hollowed portion of the TIR optic/member 205 that forms a portion of the inner wall of the chamber 206 is reflective. For example, at least that portion of the wicking structure 208 may be formed of reflective metallic nanowires or a reflective mesh. Of course, other reflective wicks may be used. The portion of the wicking structure 208 on the inner surfaces of the thermally conductive housing section 203 may be similarly formed of metallic materials or may be formed of one of the other types of wicks discussed earlier.

The working fluid directly contacts the outer surfaces of the phosphor layer 194, e.g. through gaps between the nanowires forming the portion of the wick 208 on the inner surface of the phosphor 194. The pressure within the chamber configures the working fluid to absorb heat from the phosphor 194 during operation of the device 191, to vaporize at a relatively hot location at or near the phosphor 194 as the working fluid absorbs heat. The vapor transfers heat to and condenses at a relatively cold location of the copper section in contact with the heat sink 195, and the condensed working fluid returns as a liquid to the relatively hot location at or around the phosphor 194.

As in several earlier examples, the LEDs 196 are separate and apart from the phosphor 194 within the mechanism 193, and as a result, the phosphor is remotely deployed relative to the LEDs 196. The LEDs are additional active optical processing elements, in this case outside of the mechanism 193, for supplying the pumping energy to the phosphor 194. The LEDs 196 are mounted around the inner circumferential surface of an outer ring of an LED support 198. In addition to the ring, the LED support 198 includes a circular plate for attachment to the heat sink 195. The LED support 198 is formed of a thermally conductive material similar to the materials used for the heat sinks and/or for the thermally conductive housing sections in the earlier example. The LED support 198 provides structural support for the LEDs 196 as well as thermal conductivity to transfer heat from the LEDs 196 to the upper surface of the heat sink, for dissipation to the ambient environment, that is to say to atmosphere in the present example. In the example, the LEDs emit optical energy in a spectral range below 420 nm, that is to say, in the near UV range or the UV range.

Each of the LEDs 196 is oriented with its respective axis of emission aligned at least substantially along a radius of the device 191, to direct emitted light inward along the radius toward the central axis of the device 191. To provide an efficient coupling of light from each LED into the optic 205, the device 191 includes a collimating optic 209 for each LED 196. The collimating optic 209 fits between the optical output of the respective LED 196 and a dichroic filter 210, and the dichroic filter 210 in turn is positioned against the exterior surface of the TIR optic 205.

Each collimating optic 209 may be formed of a transparent material such as an appropriate glass or plastic, which provides a high optical transmissivity with respect to light from the LEDs 196. The optic 209 is configured to reflect light within the optic back from its lateral surfaces towards the exit surface at the interface with the dichroic filter 210. For that purpose, the lateral surface of each collimating optic 209 with a material providing an inward facing reflector, or the outer surface may be treated or otherwise configured to reflect light by total internal reflection. In this way, the optic 209 collimates light from the respective LED and directs substantially all of that light for output to the dichroic filter 210.

Each collimating optic 209 may be formed with an indentation and matching inner surface for accepting light from the respective LED 196. The configuration of the collimating optic 209 may provide close proximity or contact with the LED output, although an optical gel or adhesive may be provided for index of refraction matching, to insure efficient light output. A similar gel or adhesive may be used at the optical coupling of the collimating optic 209 to the dichroic filter 210 and/or between the dichroic filter 210 and external surface of the TIR optic 205.

A dichroic filter 210 passes light in a first wavelength band and reflects light outside that wavelength band. In this example, the dichroic filters 210 pass light below 420 nm and reflect light at or above 430 nm. The LEDs 196 emit optical energy in the near UV or UV (ultraviolet) range. Hence, in the illustrated arrangement, the dichroic filters 210 allow light from the LEDs 196 to pass through at a relatively high incident angle with respect to the outer surface of the TIR optic 205 and thus enter the optic 205.

The LEDs 196 are arranged and the collimating optics 209 are configured so that most of the light from the LEDs 196 are directed at least substantially radially inward, that is to say, so as to impact the phosphor layer 194 in the mechanism 193 located in the lower portion of the optic 205 at and around the central axis of the light emitting device 191. Any light entering the optic 205 from the LEDs 196 and the collimating optics 205, which may be directed down toward the lower face of the optic 205, may be reflected upward by total internal reflection to insure most such light reaches the phosphor 194.

The phosphor in this example comprises one or more optoluminescent materials of a type excited by optical energy in a range that includes at least a substantial portion of the wavelength range of the emissions from the LEDs 196, in this case light in the near UV and/or UV range. Stated another way, the rated wavelength of emissions of the LEDs 196 falls within the excitation spectrum of the phosphor material(s). For example, the LEDs may be near UV LEDs, such as LEDs rated to emit 405 nm near UV light; and in such a case, the excitation spectrum of each phosphor material in the layer 194 would include 405 nm. The dichroic filters 210 allow 405 nm light from the LEDs to enter the optic 205 to reach and excite the phosphor at 194. The phosphor in turn emits light if one or more different spectra, in response to the 405 nm excitation energy. For example, a combination of three or more broad emission spectra phosphor materials may be excited together to provide a combination of spectra that together approximate white light of a desirable characteristic.

The light produced by excitation of the phosphor 194, either directly or upon reflection from the reflective wick, passes back into the TIR optic 205. Most if not all of the light produced by the excitation of the phosphor will be in the range above 430 nm. Hence, any such light that goes back toward the dichroic filters 210 will be reflected by the dichroic filters 210. Excitation light reaching the lateral surface of the TIR optic 205 at relatively shallow angles will be reflected by total internal reflection toward the output surface, the top surface in the illustrated orientation. Light emitted or reflected toward the output surface, however, will reach that surface at a relatively steep angle with respect to that surface and therefore will pass through as an output of the device 191.

During this operation of the light emitting device 191, the ring 198 transfers heat generated by the LEDs 196 to the heat sink 195 for dissipation. The operation of the thermal conductivity and phase transition heat transfer mechanism 193 transfers heat from the phosphor and the proximal end of the optic 205 through the cold interface to the heat sink 195 for dissipation.

The examples outlined above have provided remote phosphor deployments with respect to the source, for example, where the phosphor is in a mechanism outside of or separate from the package that include the chip of the solid state device(s) forming the source. It is also contemplated that the phosphor and the source both may be included within the thermal conductivity and phase transition heat transfer mechanism. It may be helpful to consider some examples. Although the source may be a semiconductor chip or other device inside the mechanism, we will use an example in which the semiconductor light emitter is formed of nanowires that also serve as a portion of the wick.

FIG. 14 is a top view, and FIG. 15 is an isometric view, of a device or light engine for emitting light. The illustrated device 301 could be used as a light engine of a light fixture, although the exemplary configuration is particularly configured for use in a lamp or 'light bulb,' for example, in combination with a transparent, translucent or colored transmissive globe like the globe in the example of FIGS. 5 and 6 but not shown here for convenience.

As in the earlier examples, the light emitting device 301 may operate at any orientation, although a particular orientation is illustrated for convenience. Some aspects of the following description of the light emitting device 301 use directional terms corresponding to the illustrated orientation, for convenience only. Such directional terms may help with understanding of this description of the example of FIGS. 14-16B but are not intended to be limiting in any way.

The light emitting device 301 includes a light emitter that is integrated with a thermal conductivity and phase transition heat transfer mechanism, represented together as one integral element 303 in the drawings. The mechanism 303 also includes a phosphor 325, as discussed in more detail, later. Heat is transferred from the apparatus 303 to a heat sink 305. The heat sink 305 is formed of a highly thermally conductive material, typically a metal such as copper or aluminum, although other materials, such as thermally conductive plastics and ceramics, may be used. The heat sink 305 in our example has a core 307 having a central passage, a wall of which forms a fairly tight structural and thermal connection to the outer surface of a portion of the housing of the apparatus 303. The rest of the apparatus 303 extends upward or away from the passage in the core 307 of the heat sink 305, to form a pedestal or the like with a light emitting diode at or near the distal end. Extending radially outward from the core 307, the heat sink 305 has a number of fins 309 for radiating heat to the ambient atmosphere. Straight radial fins are shown, for convenience, although other shapes/contours may be used, e.g. to promote heat transfer and/or to allow a desired amount of light from the emitter and phosphor to pass down between the fins.

FIG. 16A is a cross-sectional view taken along line A-A of FIG. 14, and FIG. 16B is an enlarged detail view of a portion of the optical/electrical emitter 303 and heat sink 305 corresponding to that encircled by the arrow B-B in FIG. 16A. As illustrated, the light emitting device 301 includes a housing having a section 313 that is thermally conductive and a member 315 that is at least partially optically transmissive. In this example, the thermally conductive section 313 consists of a hollow copper cylinder or tube having a circular cross-section. A substantial portion of the copper section 313 of the housing extends down into the passage through the core 307 of the heat sink 305. The copper section 313 may be press fitted into the passage or be otherwise connected and thermally coupled to the heat sink 305 in any appropriate manner suitable for efficient heat transfer and to provide structural support that may be necessary for the apparatus 303. The end of the copper cylinder or tube of section 313 opposite the optically transmissive member 315 is closed, e.g. by a flat circular section of copper.

In this example, the optically transmissive member 315 consists of a hollow glass cylinder or tube having a circular cross-section and closed at one end by a curved or dome-shaped section of the glass. The cylindrical thermally conductive section 313 and the optically transmissive member 315 have approximately the same lateral dimensions so as to form a relatively straight continuous cylinder, although other lateral and cross-sectional shapes could be used. For example, one or both of the elements 313, 315 could vary in shape and/or dimension along the lateral length of the light emitter 303, e.g. so that the region away from the heat sink 305 is somewhat enlarged or bulbous at the end of the pedestal. Also, the distal end of the optically transmissive member 315 (furthest away from the heat sink 305) could have other shapes, e.g. to be flat or concave instead of the illustrated dome shape.

The glass optically transmissive member 315 is connected to the copper thermally conductive section 313 of the light emitter 303 to form a housing enclosing a vapor chamber, a semiconductor light emitting device and a phosphor 325. Specifically, the section 313 and the member 315 are connected so as to form a vapor tight seal for the chamber. The two elements may be joined by a glass frit process or by application of a suitable epoxy, at the glass/copper interface.

Glass and copper are given by way of examples of the materials of the optically transmissive member 315 and the thermally conductive section 313. Those skilled in the art will appreciate that other optically transmissive materials and thermally conductive materials may be used.

The semiconductor light emitting device in this example includes semiconductor nanowires forming a light emitting diode (LED) 317, within the chamber. In this example, the semiconductor nanowires forming the LED 317 are formed or mounted on the curved interior surface at the distal end of the optically transmissive member 315.

Figure 17:
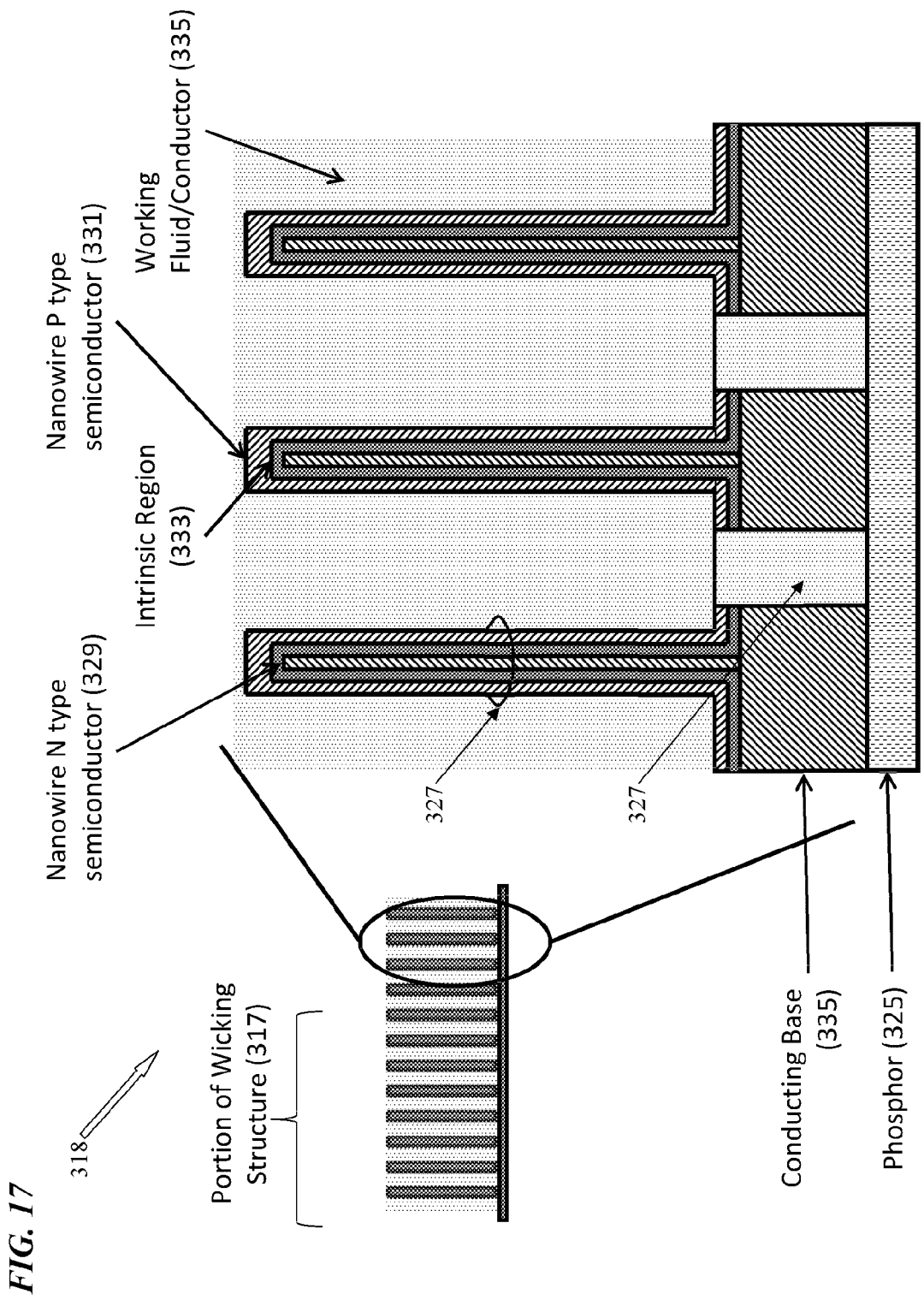
FIG. 17 is an enlarged detailed view of a portion of the semiconductor transducer in the apparatus of FIG. 16B, including a number of the semiconductor nanowires of the wick.

FIG. 17 shows an example of a section of the LED type semiconductor light emitting device 317, utilizing semiconductor nanowires 327 in portion 323a of the wicking structure 323. As discussed herein, applicable semiconductor light emitters essentially include any of a wide range light emitting or generating devices formed from organic or inorganic semiconductor materials.

The light emitting device 318 formed using the semiconductor nanowire wick 317, includes a conductive base 335. The base may be formed of an appropriate conductive material, in this case, over the phosphor layer 325. For an arrangement like that of FIGS. 16B and 17, where the emitter 317, 318 is adjacent to the phosphor layer 325 on the optically transmissive member 315, the conductive base 335 may also be optically transmissive. For example, the conductive base 335 can be formed of Indium Tin Oxide (ITO), other similar transparent conductive oxides, transparent conducting polymers, or layers consisting of transparent carbon nanotubes. In the example of FIG. 17, the transparent conductive base 335 is formed on the phosphor 325. Although not separately shown in FIG. 17, an electrical connection will be provided to the base 335, e.g. by one of the leads shown in FIG. 15, to provide one of the current path couplings to the semiconductor light emitter 317.

The light emitter 318 also includes nanowires 327 grown to extend out from the conductive base 335 to form elements of the wick 317. Each individual semiconductor nanowire 327 in the example includes an inner nanowire 329 as a core and an outer nanowire 331. The inner and outer nanowires are doped with different materials so as to be of different semiconductor types. In the example, the inner nanowire 329 is an N type semiconductor, and the outer nanowire 331 is a P type semiconductor, although obviously, the types could be reversed. As a result of the semiconductor growth and doping processes, there is semiconductor junction or intrinsic region 333 formed between the two semiconductor type nanowires 329, 331. In the example, the material forming the intrinsic region and the P type semiconductor also extends over the inner surface(s) of the conductive base 335 between the N type inner nanowires 329. Those skilled in the art will recognize that the doping may be applied so as to essentially reverse the semiconductor types, e.g. so that the inner core nanowire 329 is a P type semiconductor and the outer nanowire 331 is an N type semiconductor.

Although not shown, reflectors may be provided at the distal ends (away from the base 335) of the semiconductor nanowires 327 to direct more of the light produced by the nanowire diodes back through the base 335, the phosphor 325 and the curved distal section of the light transmissive member 315.

FIG. 17 also illustrates some of the working fluid 335 of the phase transition cycle of the heat transfer mechanism. The working fluid 335 directly contacts the outer surface(s) of at least the nanowires 327 of the semiconductor transducer, so that the fluid 335 may efficiently absorb heat from the emitter 318 during operation of the transducer. The working fluid may also directly contact at least some surface areas of the phosphor 325, for example, through vias formed through the semiconductor layers and base on the light emitting device 318. As noted, the conductive base 25 provides one of the electrical connections to the semiconductor nanowires 27, in this example, to the N type semiconductor inner nanowires 329. Although the electrical connection to the P type semiconductor outer nanowires 331 could be provided via the working fluid 335, other types of electrical connections to the outer nanowires 331 could be provided, e.g. in the form of one of the leads in the example of FIG. 15.

For an electrical-to-optical energy conversion, like the light emitting device 301 of FIGS. 14-15A, the inner and outer nanowires together form a light emitting diode. A voltage is applied to produce a drive current through the diode. Application of a voltage at or above the diode turn-on threshold, across the P-N junction at the intrinsic region 333, causes each of each of the nanowires 327 to produce light.

The discussion of FIG. 17 to this point focused on the semiconductor structure of the transducer 317 within the chamber and the light emitter operation. However, the nanowires 327 also form part of the wicking structure 317 of the combined phase transition and heat transfer mechanism. The spacing between the nanowires 327 is sufficiently small so as to facilitate capillary action on the working fluid 35, so that the nanowires 27 also function as portion of the wicking structure in the mechanism 303 of FIGS. 14-16B. Other portions of the overall wicking structure are discussed more, later.

The glass forming the optically transmissive member 315 may be transparent or translucent or exhibit other transmissive characteristics (e.g. non-white color filtering), depending on the application for the device 301. The glass of the member 315 permits emission of at least some light from the LED 317 as an output of the light emitting device 301.

For purposes of operating as a thermal conductivity and phase transition heat transfer mechanism, the light emitting device 301 also includes a working fluid within the chamber. The working fluid directly contacts the outer surfaces of the nanowires of the LED wicking structure 317 and may contact at least some surface(s) of the phosphor layer 325 through gaps or vias through the semiconductor structure between the individual nanowires. The pressure within the chamber configures the working fluid to absorb heat from the LED 317, particularly from the nanowires, during operation of the device 301. The fluid vaporizes at a relatively hot location at or near the semiconductor nanowires of the LED 317 as the working fluid absorbs heat. The vapor transfers heat to and condenses at a relatively cold location of the copper section 313 in contact with the heat sink 305, and the condensed working fluid returns as a liquid to the relatively hot location at or around the LED 317.

As in the earlier examples, the device 301 of FIG. 14 includes a wicking structure mounted within the chamber to facilitate flow of condensed liquid of the working fluid from the cold location to the hot location. Together, the housing, the chamber, the working fluid and the wicking structure form a thermal conductivity and phase transition heat transfer mechanism for transferring heat away from the LED 317, in this case, to the heat sink 305. The semiconductor nanowires of LED 317 on the inner curved surface of the glass member 315 are configured to serve as a portion of the wicking structure.

In addition to the nanowire wick 317 of the LED, the wicking structure includes a non-LED (not semiconductor nanowires) wick 321 formed on the portions of the inner surface of the glass member 315 in regions other than the region(s) covered by the structure of the LED 317. The overall wicking structure further includes a non-LED (not semiconductor nanowires) wick 323 on the inner surface of the copper section 313. The wicks 321 and 323 may take many forms, as discussed above with regard to various earlier examples. The wicks may be similar to each other or different. In the example of FIGS. 14-16B, the non-LED wick 321 in the glass member 315 may be formed of a material that is at least somewhat optically transmissive, whereas the non-LED wick 323 in the copper section 313 may be at least somewhat reflective.

As outlined earlier, the light emitting device 301 include a phosphor layer 325 between the LED 317 and the curved interior surface at the distal end of the optically transmissive member 315 on which the LED is mounted. Light emerging from the LED 317 toward the curved interior surface of the optically transmissive member 315 passes through the phosphor layer 325. Some of the light excites the phosphor, and the excited phosphor converts optical energy from the LED 317 from energy in one wavelength range (the excitation band of the phosphor) to another wavelength range. For example, the phosphor 325 may convert some energy from the LED 317 from a less desirable wavelength range (e.g. near or outside the visible spectrum) to a more desirable wavelength range (e.g. to fill-in a gap in the spectral characteristic of light produced by the emitter), to improve efficiency of the light emitting device 301 and/or to improve the quality of the light output.

The phosphor layer 325 may include one type of phosphor or phosphor of a number of types, depending on the desired characteristics of the light output of the device 301. Also, the phosphor layer may extend down the inner surface of the housing, e.g. down the inner cylindrical surface of the glass member 315 to the glass/copper interface. Additional phosphor may be provided in the working fluid.

Figure 19:
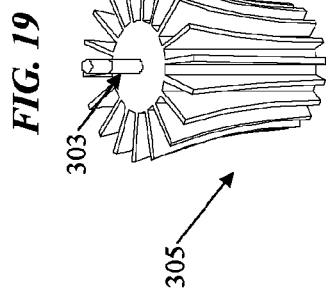
FIGS. 18 and 19 are top and isometric views of another light emitting device and heat sink as may be used in a fixture or lamp/light bulb.
Figure 20B:
FIG. 20B is an enlarged detail view of a portion of the thermal conductivity and phase transition heat transfer mechanism that incorporates the phosphor, encircled by the arrow B in FIG. 20A.
Figure 18:
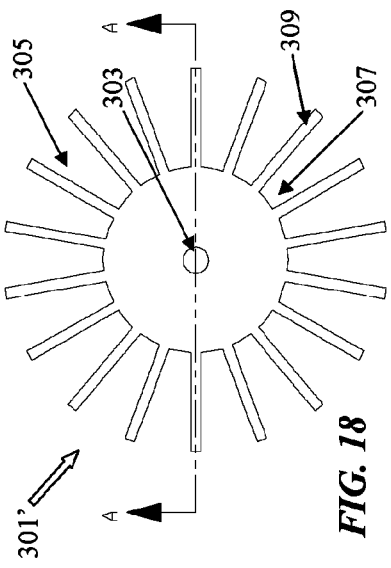
Figure 20A:
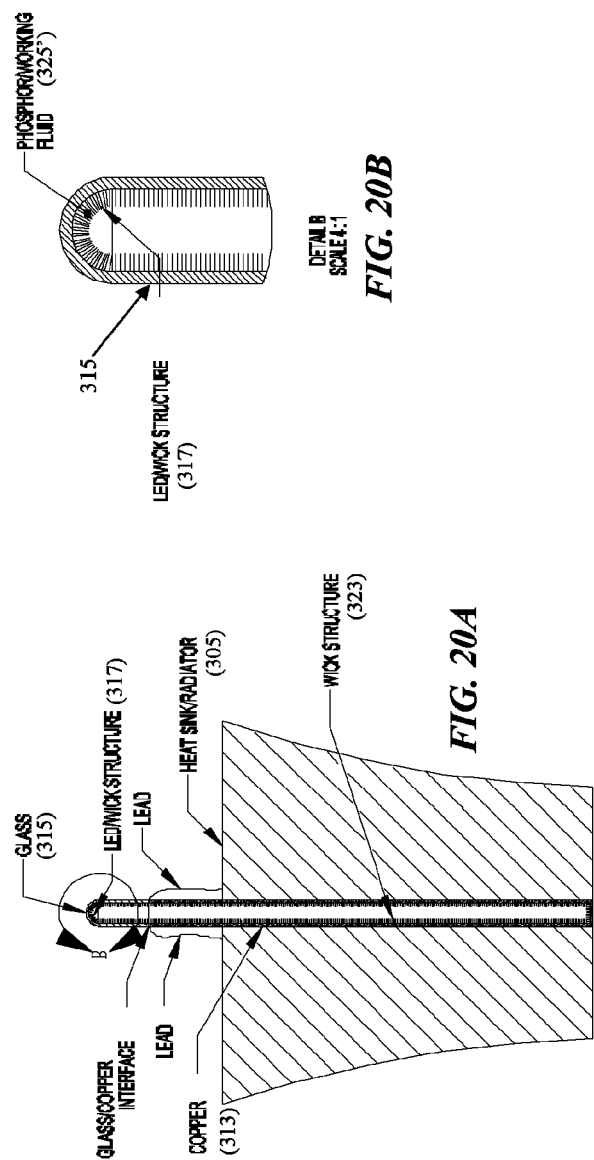
FIG. 20A is a cross-sectional view taken along line A-A of FIG. 18.

FIG. 18 is a top view, and FIG. 19 is an isometric view of another device or light engine 301' for emitting light. FIG. 20A is a cross section view taken along line A-A of FIG. 18, and FIG. 20B is an enlarged detail view of a portion of the optical/electrical emitter and heat sink of FIG. 20A, showing the addition of a phosphor layer. The device or light engine 301' is generally similar to the device 301 of FIGS. 14-16A, like reference numerals identify corresponding elements, and the discussion above can be referenced for detailed information about the corresponding elements. The device 301' does include a phosphor. However, instead of including the phosphor as a layer between the light emitting diode and the surface of the optically transmissive member 315, the phosphor in the device 301' is carried by the working fluid 325'. A phosphor bearing working fluid as may be used in the device 301' has been discussed earlier with regard to earlier examples.

Those skilled in the art will appreciate that the teachings above may be applied in a variety of different ways and are not limited to the specific structures, materials and arrangements shown in the drawings and described above. For example, each of the instructed devices includes one thermal conductivity and phase transition heat transfer mechanism that incorporates phosphor. It is contemplated that a single light emitting device or apparatus may include multiple thermal conductivity and phase transition heat transfer mechanisms each with phosphor included therein.

It should be apparent from the discussion above that when an element is referred to as being "on", "attached" to, "connected" to, "coupled" with, "contacting," etc., another element, it can be directly on, attached to, connected to, coupled with or contacting the other element or intervening elements or spacing may also be present. In contrast, when an element is referred to as being, for example, "directly on", "directly attached" to, "directly connected" to, "directly coupled" with or "directly contacting" another element, there are no intervening elements present, although in some cases there may be intervening elements or layers of up to a micron or so, so long as such layers or elements do no substantially reduce thermal conductivity. It will also be appreciated by those of skill in the art that references to a structure or feature that is disposed "adjacent" another feature may have portions that are nearby or even overlap or underlie the adjacent feature.

Similarly, spatially relative terms, such as "under," "below," "lower," "over," "upper" related orientation or directional terms and the like, that may have been used above for ease of description to describe one element or feature's relationship to another element(s) or feature(s) orientation or direction as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A lighting device, comprising:
an opto-luminescent phosphor, for excitation by optical energy of a first spectral characteristic and when excited emitting light of a second spectral characteristic different from the first spectral characteristic;
a source of optical excitation energy, for supplying the optical excitation energy to the phosphor;
a housing having a section that is thermally conductive and at least one member, that is at least partially optically transmissive for allowing emission of light emitted from the phosphor as an output of the lighting device, the at least one optically transmissive member being connected to the thermally conductive section of the housing to form a seal for a vapor tight chamber, the phosphor being contained within the chamber; and
a working fluid within the chamber, wherein pressure within the chamber configures the working fluid to absorb heat during operation of the lighting device, to vaporize at a relatively hot location at or near at least a portion of the opto-luminescent phosphor as the working fluid absorbs heat, to transfer heat to and condense at a relatively cold location, and to return as a liquid to the relatively hot location,
wherein the working fluid is in direct contact with or contains at least a portion of the opto-luminescent phosphor.

2. The lighting device of claim 1, wherein the housing, the chamber and the working fluid together form a thermal conductivity and phase transition heat transfer mechanism for transferring heat away from at least some of the phosphor contained within the chamber.

3. The lighting device of claim 1, further comprising a wicking structure mounted within the chamber to facilitate flow of condensed liquid of the working fluid from the cold location to the hot location.

4. The lighting device of claim 3, wherein the opto-luminescent phosphor is incorporated in a portion of the wicking structure.

5. The lighting device of claim 4, wherein the opto-luminescent phosphor incorporated in the portion of the wicking structure comprises phosphor bearing nanowires.

6. The lighting device of claim 5, wherein another portion of the wicking structure comprises nanowires.

7. The lighting device of claim 6, wherein the nanowires of the other portion of the wicking structure are at least partially reflective.

8. The lighting device of claim 3, wherein at least a portion of the wicking structure is at least partially reflective.

9. The lighting device of claim 1, wherein:
the source of optical excitation energy is outside of the housing of the thermal conductivity and phase transition heat transfer mechanism so that the opto-luminescent phosphor is remotely deployed with respect to the source, and
the source of optical excitation energy is coupled to supply optical excitation energy in at least the first wavelength range into the chamber through the at least one optically transmissive member of the housing.

10. The lighting device of claim 9, wherein the source is a type of emitter selected from the group consisting of: a light emitting diode (LED), an organic light emitting diode (OLED), a laser diode, a semiconductor nanowire light emitter, and an electroluminescent device.

11. The lighting device of claim 1, wherein:
the source of optical excitation energy is located at least partially inside of the housing of the thermal conductivity and phase transition heat transfer mechanism, and
at least a portion of the source of optical excitation energy is at least partially exposed within the chamber so as to be in direct contact with the working fluid within the chamber.

12. The lighting device of claim 11, wherein the source is a type of emitter selected from the group consisting of: a light emitting diode (LED), an organic light emitting diode (OLED), a laser diode, a semiconductor nanowire light emitter, and an electroluminescent device.

13. The lighting device of claim 11, further comprising a wicking structure mounted within the chamber to facilitate flow of condensed liquid of the working fluid from the cold location to the hot location.

14. The lighting device of claim 13, wherein at least a portion of the wicking structure is at least partially reflective.

15. The lighting device of claim 13, wherein at least a portion of the wicking structure comprises nanowires.

16. The lighting device of claim 15, wherein the nanowires are at least partially reflective.

17. The lighting device of claim 15, wherein the nanowires form one or more semiconductor light emitters serving as the source.

18. The lighting device of claim 17, wherein another portion of the wicking structure comprises nanowires.

19. The lighting device of claim 18, wherein the nanowires of the other portion of the wicking structure bear at least some of the phosphor.

20. A lighting device, comprising:
a source of optical excitation energy;
a thermal conductivity and phase transition heat transfer mechanism, comprising a housing, a working fluid and a wicking structure contained in a chamber formed by the housing,
the housing having at least one optically transmissive member coupled to the source, for receiving the optical excitation energy and for allowing emission of light as an output of the device; and
an opto-luminescent phosphor for conversion of at least some of the optical excitation energy received from the source in a first wavelength range into visible light of a second wavelength range for inclusion in the emission as the output of the lighting device,
wherein the opto-luminescent phosphor is contained within the chamber formed by the housing of the thermal conductivity and phase transition heat transfer mechanism.

21. The lighting device of claim 20, wherein the source comprises one or more solid state light emitters.

22. The lighting device of claim 20, wherein the device is configured as a lighting fixture.

23. The lighting device of claim 20, wherein the device is configured as a lamp.

24. The lighting device of claim 20, wherein the opto-luminescent phosphor is incorporated in a portion of the wicking structure.

25. The lighting device of claim 24, wherein the opto-luminescent phosphor incorporated in the portion of the wicking structure comprises phosphor bearing nanowires.

26. The lighting device of claim 20, wherein the opto-luminescent phosphor is carried in the working fluid of the thermal conductivity and phase transition heat transfer mechanism.

27. The lighting device of claim 26, wherein at least a portion of the wicking structure comprises nanowires.

28. The lighting device of claim 27, wherein the nanowires are at least partially reflective.

29. The lighting device of claim 20, wherein at least a portion of the wicking structure is at least partially reflective.

30. The lighting device of claim 20, wherein the source is a type of emitter selected from the group consisting of: a light emitting diode (LED), an organic light emitting diode (OLED), a laser diode, a semiconductor nanowire light emitter, and an electroluminescent device.

31. A thermal conductivity and phase transition heat transfer mechanism comprising:
a housing having a member that is thermally conductive and a member, that is at least partially optically transmissive, the optically transmissive member being connected to the thermally conductive section of the housing to form a seal for a vapor tight chamber;
an opto-luminescent phosphor contained within the chamber for emitting light through the optically transmissive member when the phosphor is excited; and
a working fluid within the chamber, wherein pressure within the chamber configures the working fluid to absorb heat during operation of the lighting device, to vaporize at a relatively hot location at or near at least a portion of the opto-luminescent phosphor as the working fluid absorbs heat including at least some heat from some of the phosphor, to transfer heat to and condense at a relatively cold location, and to return as a liquid to the relatively hot location,
wherein the working fluid is in direct contact with or contains at least a portion of the opto-luminescent phosphor.

32. The mechanism of claim 31, wherein the phosphor is included in the working fluid.

33. The mechanism of claim 31, further comprising:
a wicking structure on at least one inner wall of the chamber,
wherein the phosphor is included in the wicking structure.

34. The mechanism of claim 31, wherein the phosphor is included in a layer formed on an inner wall of the chamber.

35. The mechanism of claim 34, wherein the layer is formed on an inner surface of the optically transmissive member.

\* \* \* \* \*